US012622226B2

(12) United States Patent
Ushida et al.

(10) Patent No.: US 12,622,226 B2
(45) Date of Patent: May 5, 2026

(54) SUBSTRATE PROCESSING APPARATUS

(71) Applicant: DAIKIN FINETECH, LTD., Yamatokoriyama (JP)

(72) Inventors: Satoshi Ushida, Nara (JP); Kenichiro Saito, Nara (JP)

(73) Assignee: DAIKIN FINETECH, LTD., Nara (JP)

( * ) Notice: Subject to any disclaimer, the term of this patent is extended or adjusted under 35 U.S.C. 154(b) by 197 days.

(21) Appl. No.: 18/580,494

(22) PCT Filed: Jun. 24, 2022

(86) PCT No.: PCT/JP2022/025265
§ 371 (c)(1),
(2) Date: Jan. 18, 2024

(87) PCT Pub. No.: WO2023/002801
PCT Pub. Date: Jan. 26, 2023

(65) Prior Publication Data
US 2024/0321624 A1      Sep. 26, 2024

(30) Foreign Application Priority Data
Jul. 21, 2021    (JP) ................................. 2021-120561

(51) Int. Cl.
*H10P 72/76*         (2026.01)
*G03F 7/30*          (2006.01)

(52) U.S. Cl.
CPC ............ *H10P 72/7618* (2026.01); *G03F 7/30* (2013.01)

(58) Field of Classification Search
CPC ............. H01L 21/68764; H01L 21/027; H01L 21/304; H01L 21/68728; H01L 21/306;
(Continued)

(56) References Cited

U.S. PATENT DOCUMENTS 7,735,710 B2 *  6/2010  Kurita .............. H01L 21/68728
                                                        228/49.4
2014/0041689 A1   2/2014  Namba
(Continued)

FOREIGN PATENT DOCUMENTS

JP          11-111822          4/1999
JP          2014-036168        2/2014
(Continued)

OTHER PUBLICATIONS

International Search Report issued in International Application No. PCT/JP2022/025265, Sep. 6, 2022, 2 pages.

*Primary Examiner* — Alex B Efta
*Assistant Examiner* — Alexander S Wright
(74) *Attorney, Agent, or Firm* — HSML P.C.

(57)        ABSTRACT

A substrate processing apparatus A1 includes: cup 1 for storing processing solution 92 to process substrate 91; stage 2 to be raised and lowered along lifting shaft 31 extending in vertical direction z in cup 1; mount 4 provided on stage 2 to mount substrate 91; and pivoting member 5 attached to mount 4 such that pivoting member 5 is pivotable about pivoting shaft 51 provided along circumferential direction θ centered at lifting shaft 31. Pivoting member 5 includes holding portion 52 located inward of pivoting shaft 51 in radial direction r, and abutting portion 53 located outward of pivoting shaft 51 in radial direction r. As stage 2 is lowered, abutting portion 53 abuts against cup 1 to cause pivoting of pivoting member 5, thereby reducing a distance between holding portion 52 and mount 4 with substrate 91 therebetween. These configurations reduce unintended effects in processing substrate 91.

11 Claims, 17 Drawing Sheets

(58) Field of Classification Search
CPC ......... H01L 21/67051; H01L 21/67057; H01L
21/68742; H01L 21/68792; H01L
21/67017; H01L 21/683; G03F 7/30
See application file for complete search history.

(56) References Cited

U.S. PATENT DOCUMENTS

2014/0332036 A1* 11/2014 Glinsner ........... H01L 21/02052
134/33
2015/0279721 A1 10/2015 Kikumoto et al.

FOREIGN PATENT DOCUMENTS

JP 2015-188008 10/2015
JP 2017147354 * 8/2017

* cited by examiner

SUBSTRATE PROCESSING APPARATUS

TECHNICAL FIELD

The present invention relates to a substrate processing apparatus.

BACKGROUND ART

Various substrate processing apparatuses have been proposed that perform a predetermined process on a substrate made of, for example, a semiconductor such as silicon (Si). Patent document 1 discloses an example of a conventional substrate processing apparatus. The substrate processing apparatus disclosed in the document performs a lift-off process, which is a process of collectively removing a resist layer formed on a substrate and a metal layer stacked on the resist layer. The substrate processing apparatus includes a cup, a mount, and a pivoting member. The cup stores a processing solution for the lift-off process. The mount is arranged inside the cup, and is provided to mount a substrate thereon. The mount can be raised and lowered relative to the cup. The pivoting member is pivotally supported by the mount. An abutting member is provided inside the cup. When the mount is lowered with the substrate mounted thereon, the pivoting member abuts against the abutting member. This causes the pivoting of the pivoting member, and the substrate is held between the mount and the pivoting member.

PRIOR ART DOCUMENT

Patent Document

Patent Document 1: Japanese Patent No. 2017-147354

SUMMARY OF THE INVENTION

Problem to be Solved by the Invention

However, the abutting member may unduly disturb the flow of the processing solution in the cup. In another case, the resist layer and/or the metal layer removed by the lift-off process may adhere to the abutting member. As such, the abutting member may have an unintended effect during a process for the substrate.

The present invention has been proposed in view of the above circumstances, and an object thereof is to provide a substrate processing apparatus capable of reducing an unintended effect on a process for a substrate.

Means to Solve the Problem

Provided by the present invention, a substrate processing apparatus includes: a cup capable of storing a processing solution for processing a substrate; a stage configured to be raised and lowered along a lifting shaft extending in a vertical direction in the cup; a mount provided on the stage and configured to mount the substrate; and a pivoting member pivotably attached to the mount such that the pivoting member is pivotable about a pivoting shaft provided along a circumferential direction centered at the lifting shaft. The pivoting member includes a holding portion located inward of the pivoting shaft in a radial direction, and an abutting portion located outward of the pivoting shaft in the radial direction. As the stage is lowered, the abutting portion abuts against the cup to cause pivoting of the pivoting member, thereby reducing a distance between the holding portion and the mount with the substrate therebetween.

In a preferred embodiment of the present invention, the cup rotates about the lifting shaft to drain the processing solution outward in the radial direction.

In a preferred embodiment of the present invention, the cup includes an upper end, a side surface connected to the upper end, and a bottom surface connected to a lower end of the side surface, and as viewed in the vertical direction, an entirety of the bottom surface is positioned inside the upper end.

In a preferred embodiment of the present invention, the abutting portion abuts against the upper end.

In a preferred embodiment of the present invention, the abutting portion abuts against the side surface.

In a preferred embodiment of the present invention, the abutting portion includes an extending portion extending from the pivoting shaft, and a protrusion coupled to an adjustment portion provided for the extending portion, and the protrusion abuts against the upper end.

In a preferred embodiment of the present invention, the abutting portion includes an extending portion extending from the pivoting shaft, and a protrusion screwed to an adjustment portion provided for the extending portion, and as the stage is lowered, the extending portion abuts against the upper end, and thereafter the protrusion abuts against the side surface.

In a preferred embodiment of the present invention, when the substrate is subjected to a process, a surface of the processing solution is positioned above the substrate.

In a preferred embodiment of the present invention, the lifting shaft is covered with a bellows member in the cup.

Advantages of the Invention

According to the present invention, it is possible to reduce unintended effects on a process for a substrate.

Other features and advantages of the present invention will be more apparent from the detailed description given below with reference to the accompanying drawings.

MODE FOR CARRYING OUT THE INVENTION

Figure 1:
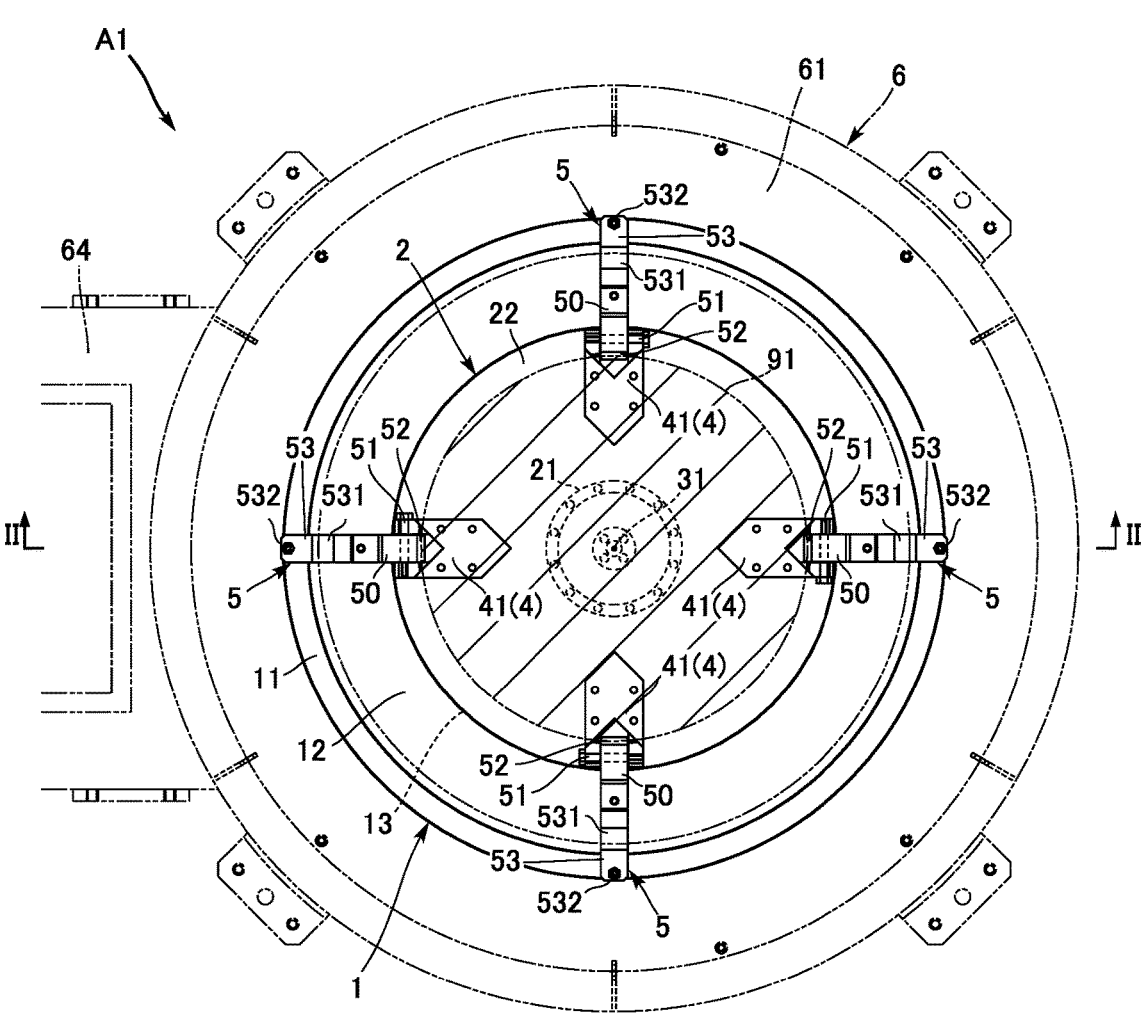
FIG. 1 is a partial plan view showing a substrate processing apparatus according to a first embodiment of the present invention.
Figure 1:
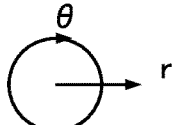

Hereinafter, preferred embodiments of the present invention will be described in detail with reference to the drawings.

The terms such as "first", "second" and "third" in the present disclosure are used merely as labels for identifying the elements accompanied with these terms and not intended to impose orders on the elements.

First Embodiment

FIGS. 1 to 9 show a substrate processing apparatus according to a first embodiment of the present invention. A substrate processing apparatus A1 according to the present embodiment includes a cup 1, a stage 2, a drive unit 3, a mount 4, a pivoting member 5, and a drainage chamber 6. The type of a process for the substrate 91 performed by the substrate processing apparatus according to the present invention is not particularly limited. The following describes an example configuration where the substrate processing apparatus performs a lift-off process, which is a process of collectively removing a resist layer formed on the substrate 91 and a metal layer stacked on the resist layer. Examples of the processes for the substrate 91 further include, in addition to the lift-off process, a process of swelling and dissolving the resist layer by immersing the substrate 91 in a processing solution 92 stored in the cup 1 and maintaining the immersed state for a long time.

Figure 2:
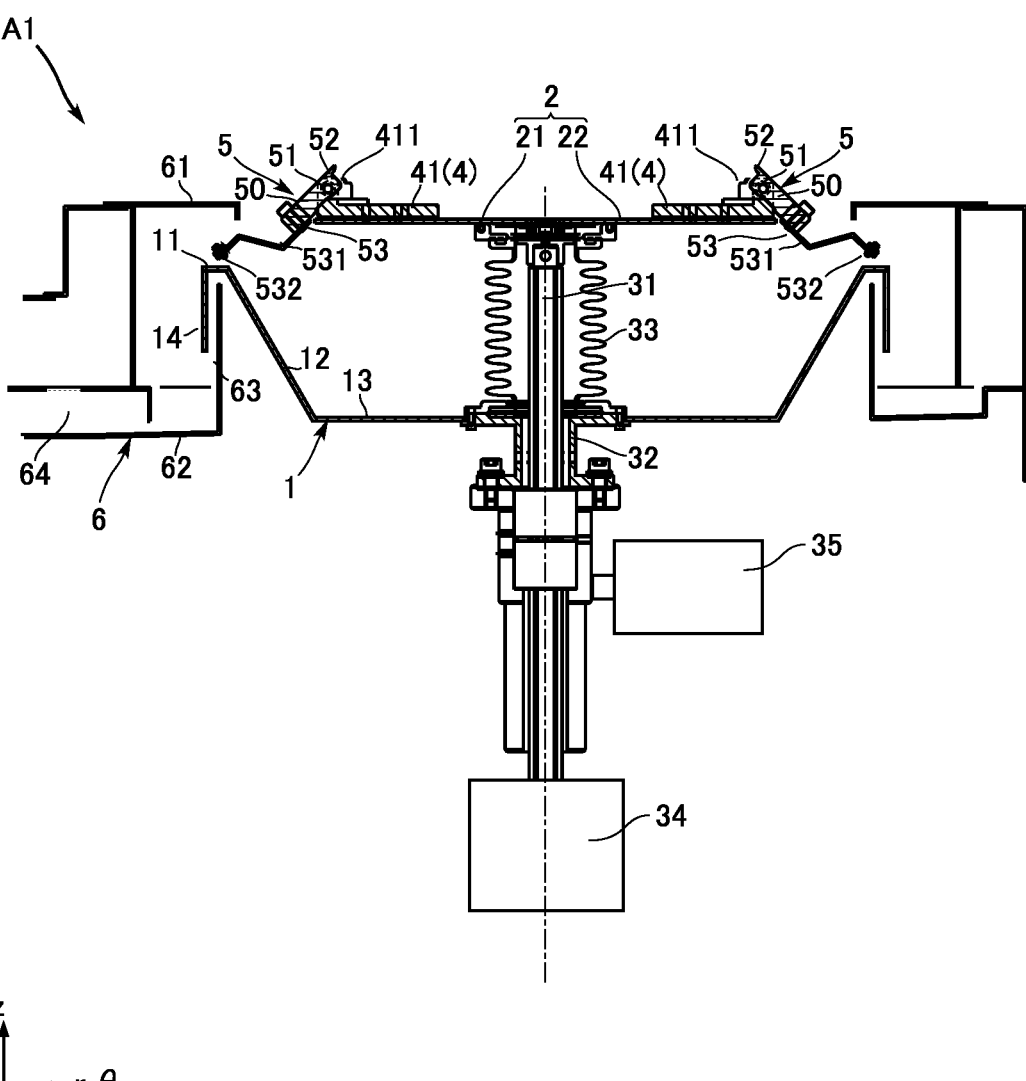
FIG. 2 is a partial cross-sectional view taken along line II-II in FIG. 1.
Figure 3:
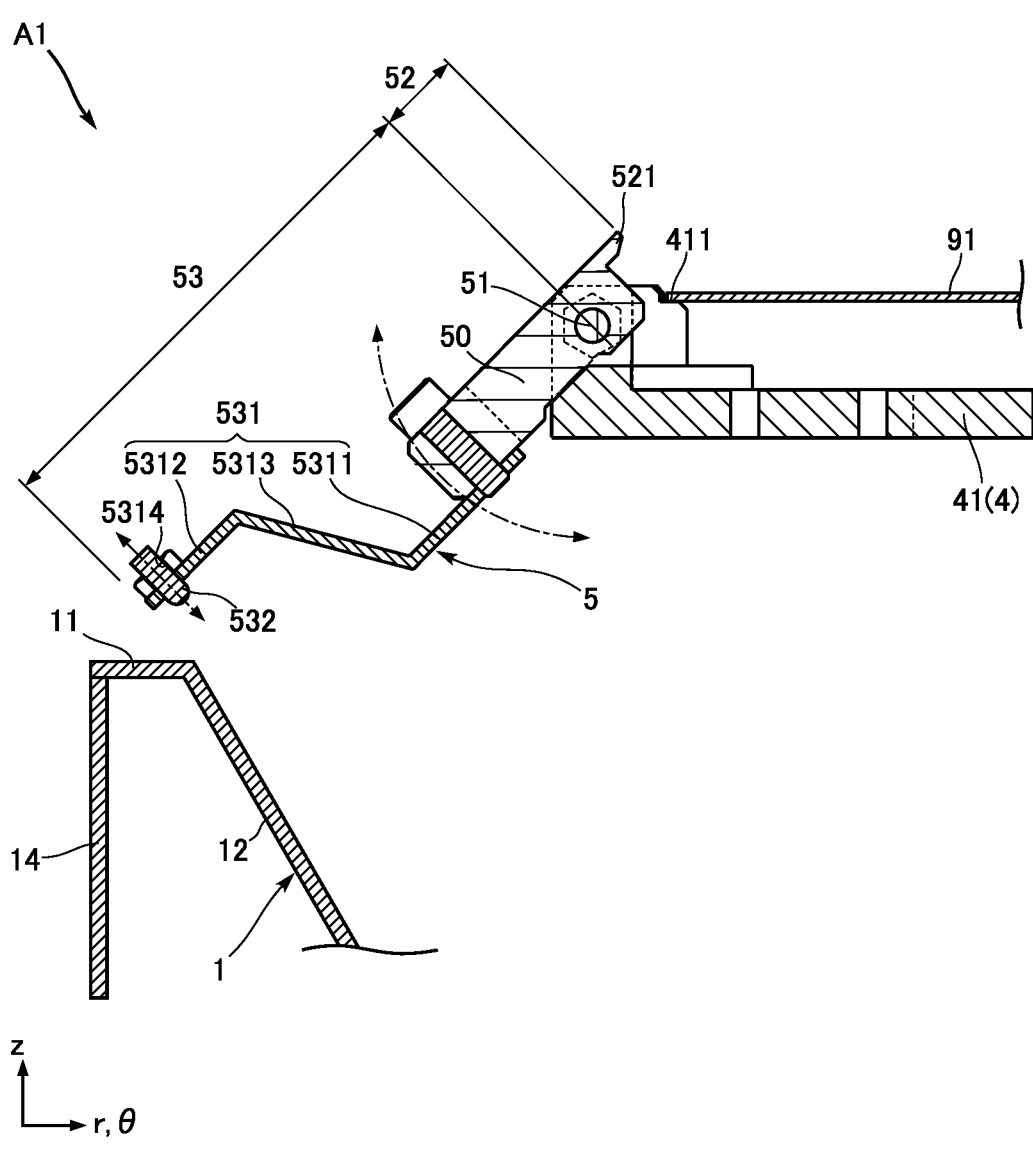
FIG. 3 is a partially enlarged cross-sectional view showing the substrate processing apparatus according to the first embodiment of the present invention.
Figure 4:
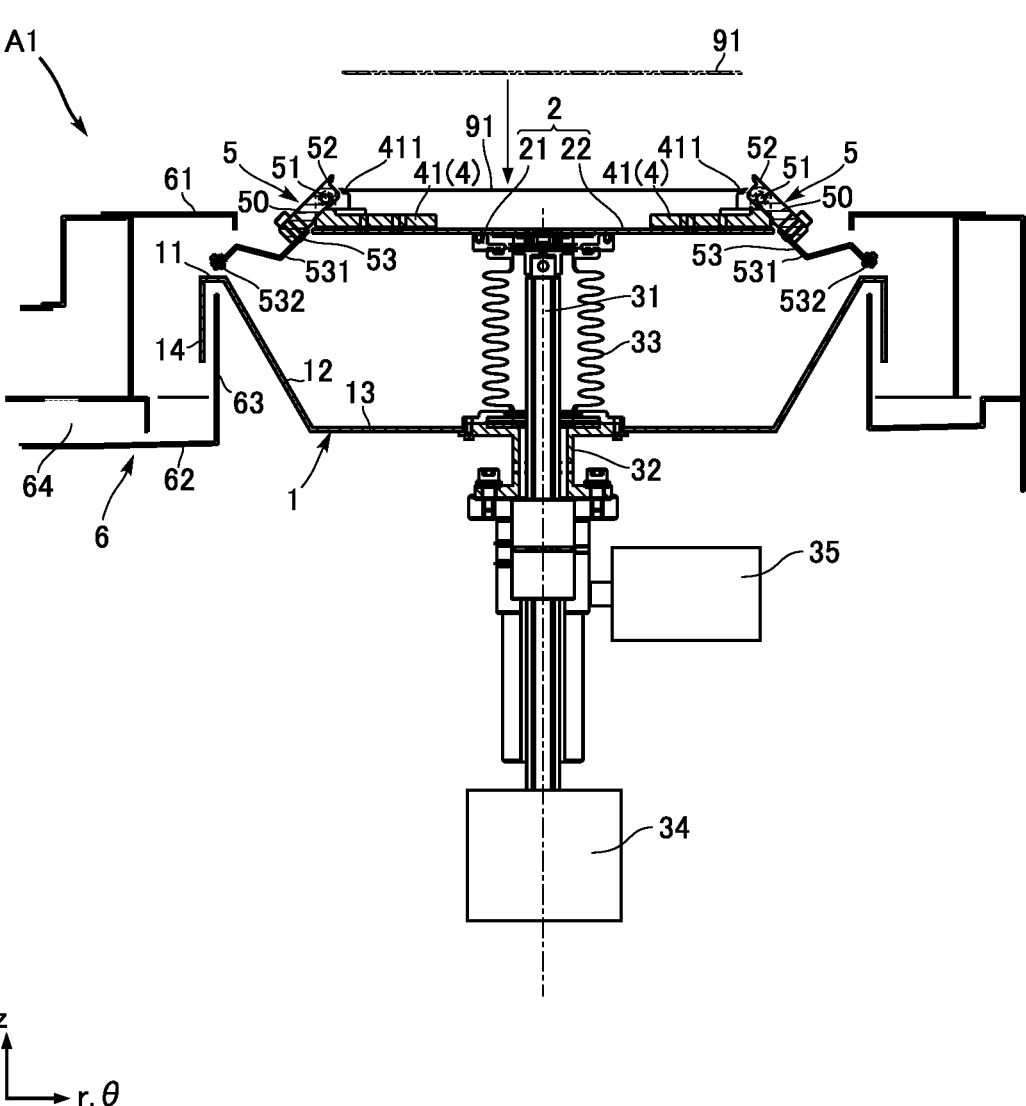
FIG. 4 is a partial cross-sectional view showing an operation of the substrate processing apparatus according to the first embodiment of the present invention.
Figure 5:
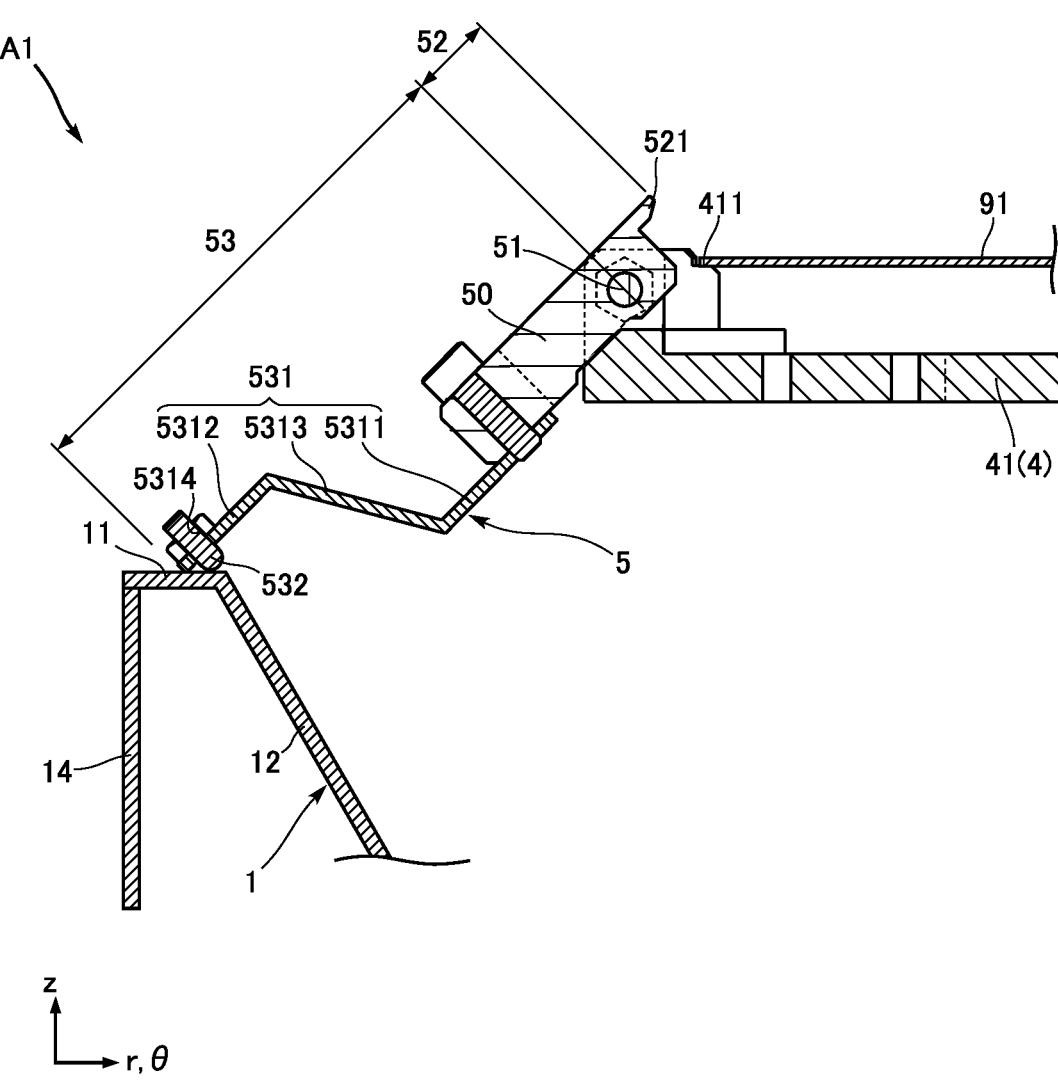
FIG. 5 is a partially enlarged cross-sectional view showing an operation of the substrate processing apparatus according to the first embodiment of the present invention.
Figure 6:
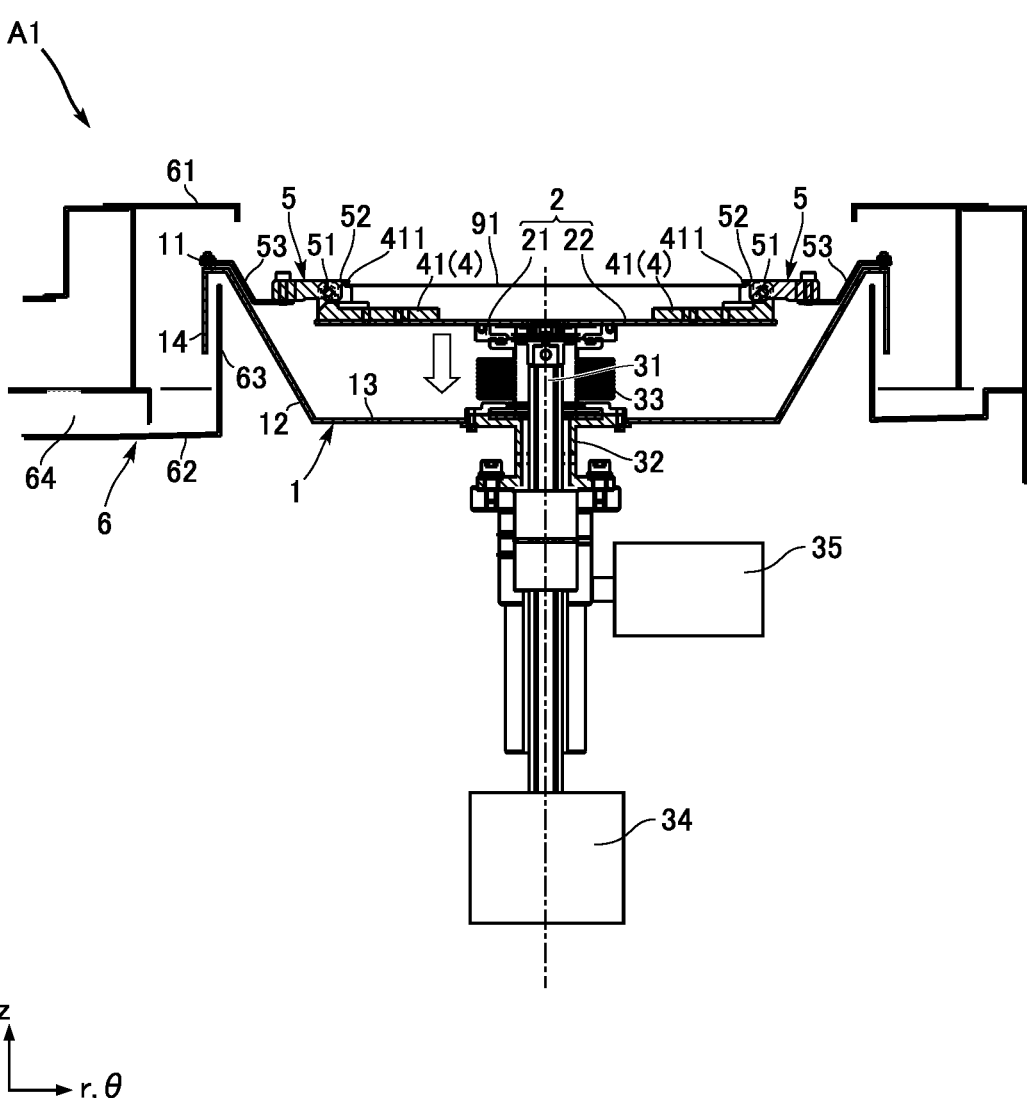
FIG. 6 is a partial cross-sectional view showing an operation of the substrate processing apparatus according to the first embodiment of the present invention.
Figure 7:
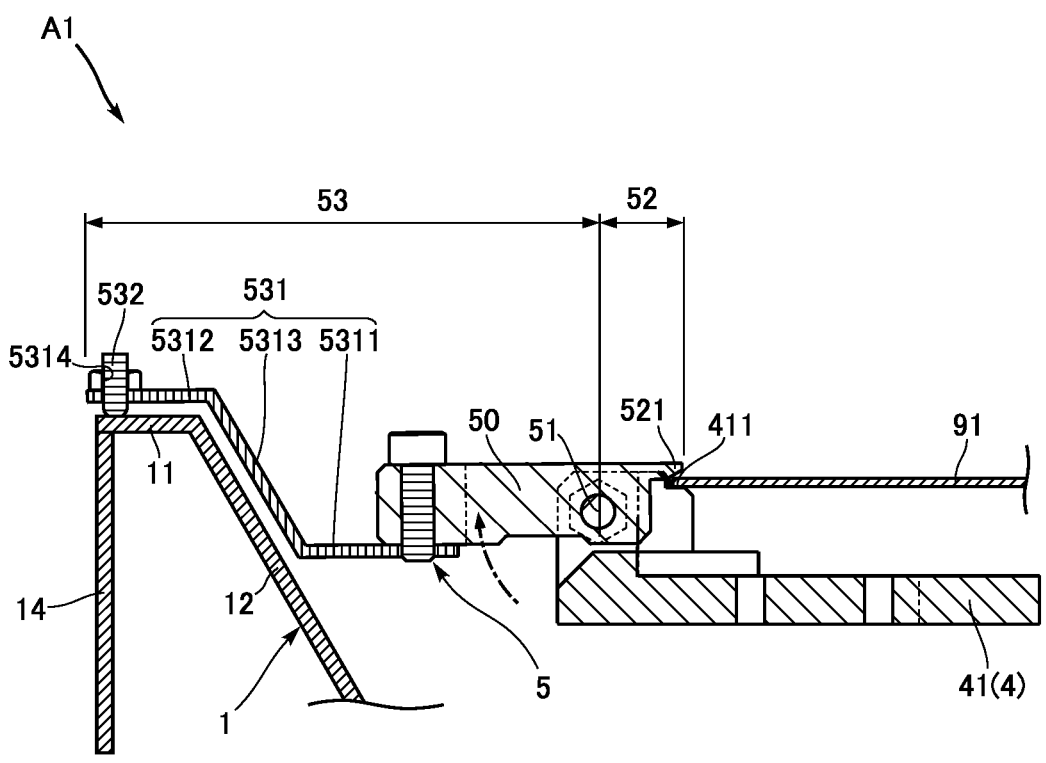
FIG. 7 is a partially enlarged cross-sectional view showing an operation of the substrate processing apparatus according to the first embodiment of the present invention.
Figure 7:
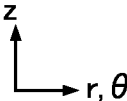
Figure 8:
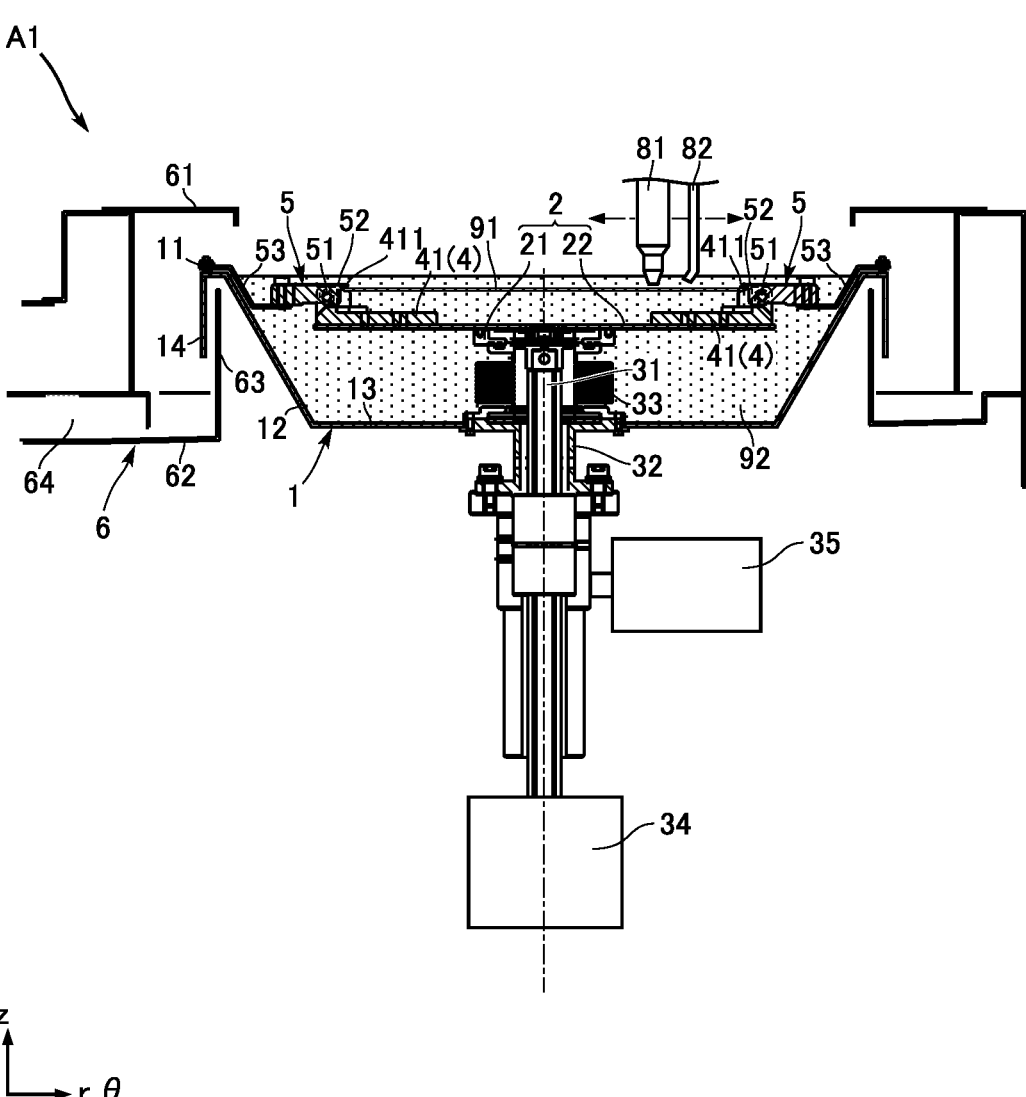
FIG. 8 is a partial cross-sectional view showing an operation of the substrate processing apparatus according to the first embodiment of the present invention.
Figure 9:
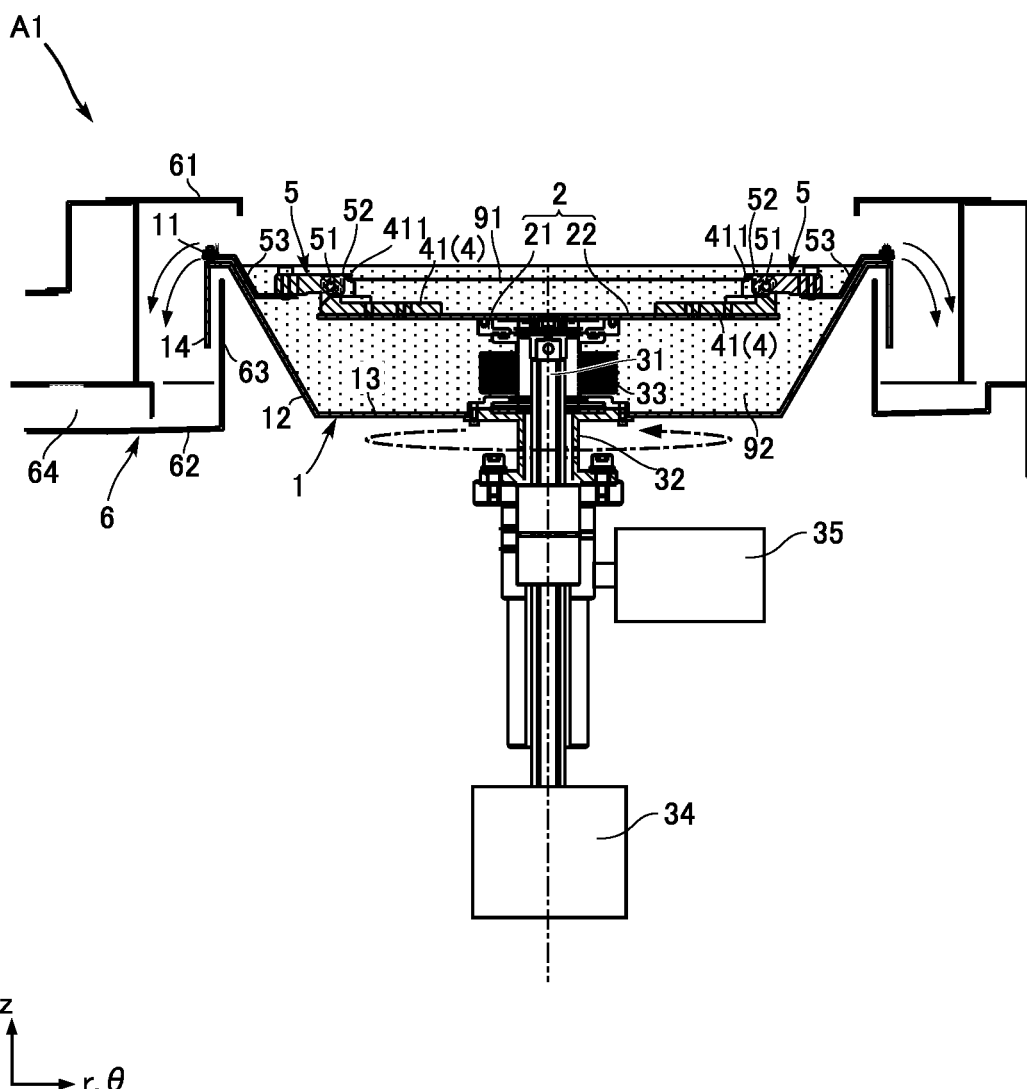
FIG. 9 is a partial cross-sectional view showing an operation of the substrate processing apparatus according to the first embodiment of the present invention.

FIG. 1 is a partial plan view showing the substrate processing apparatus A1. FIG. 2 is a partial cross-sectional view taken along line II-II in FIG. 1. FIG. 3 is a partially enlarged cross-sectional view showing the substrate processing apparatus A1. FIG. 4 is a partial cross-sectional view showing an operation of the substrate processing apparatus A1. FIG. 5 is a partially enlarged cross-sectional view showing an operation of the substrate processing apparatus A1. FIG. 6 is a partial cross-sectional view showing an operation of the substrate processing apparatus A1. FIG. 7 is a partially enlarged cross-sectional view showing an operation of the substrate processing apparatus A1. FIGS. 8 and 9 are partial cross-sectional views each showing an operation of the substrate processing apparatus A1. In these figures, a vertical direction z is the direction in which the stage 2 is raised and lowered. A circumferential direction θ is a direction centered around a lifting shaft 31 (described below) extending in the vertical direction z, and a radial direction r is a direction centered on the lifting shaft 31. FIGS. 2 to 4 each show the state where the stage 2 is located at the uppermost position during a raising/lowering operation (described below) of the stage 2. FIGS. 6 to 8 each show the state where the stage 2 is located at the lowermost position.

Cup 1

The cup 1 can store the processing solution 92 to process the substrate 91. The shape and material of the cup 1 are not particularly limited. For example, the cup 1 is made of a metal such as stainless steel. As shown in FIGS. 1 and 2, the cup 1 in the present embodiment includes an upper end 11, a side surface 12, and a bottom surface 13. In the illustrated example, the cup 1 further includes an outer wall 14. Note that the cup 1 capable of storing the processing solution 92 is not limited to the one used to store a certain amount of processing solution 92 for a predetermined period. For example, the cup 1 may also be one constantly supplied with the processing solution 92 during a predetermined processing step, temporarily holding the processing solution 92 therein, and then sequentially draining the processing solution 92.

The upper end 11 is positioned at the upper end of the cup 1 in the vertical direction z. The specific shape of the upper end 11 is not particularly limited. In the illustrated example, the upper end 11 has an annular plate shape. In the state shown in FIGS. 2 and 3, the upper end 11 is positioned under a protrusion 532 of the pivoting member 5 in the vertical direction z, and overlaps with the protrusion 532 as viewed in the vertical direction z. As described below, the specific configuration of the protrusion 532 is not particularly limited.

The side surface 12 is connected to the upper end 11, and extends downward in the vertical direction z from the upper end 11. The height of the side surface 12 in the vertical direction z is designed to accommodate the stage 2, the drive unit 3, the mount 4, and the pivoting member 5. Furthermore, the height of the side surface 12 in the vertical direction z is designed to hold the surface of the processing solution 92 at a predetermined height relative to the substrate 91. In the illustrated example, the side surface 12 is inclined and tapered, the dimension of which in the radial direction r decreases from the upper end of the side surface 12 to the lower end thereof in the vertical direction z. The side surface 12 has an annular shape as viewed in the vertical direction z. The inclination angle of the side surface 12 is not particularly limited, and may be about 30° to 75° relative to a horizontal plane (i.e., a plane that includes the radial direction r and the circumferential direction θ). In the illustrated example, the inclination angle is about 60° relative to the horizontal plane.

The bottom surface 13 is connected to the lower end of the side surface 12 in the vertical direction z. The shape of the bottom surface 13 is not particularly limited, and is circular in the illustrated example. As viewed in the vertical direction z, the entirety of the bottom surface 13 is positioned inside the upper end 11. In the illustrated example, the upper end 11 has an annular shape, and the bottom surface 13 has a circular shape. Thus, as viewed in the vertical direction z, the inner diameter of the upper end 11 is larger than the outer diameter of the bottom surface 13. The center of bottom surface 13 is provided with an opening through which the lifting shaft 31 (described below) is inserted.

The outer wall 14 is connected to the outer circumferential end of the upper end 11 in the radial direction r, and extends downward in the vertical direction z from the upper end 11. The outer wall 14 has a cylindrical shape, the height of which in the vertical direction z is lower than that of the side surface 12.

Stage 2

The stage 2 can be raised and lowered in the vertical direction z within the cup 1, and supports the mount 4. The specific configuration of the stage 2 is not particularly limited. In the illustrated example, the stage 2 includes a base 21 and a disc portion 22.

The base 21 is fixed to the upper end of the lifting shaft 31 described below. For example, the base 21 is made of a metal such as stainless steel or resin. The disc portion 22 is fixed to the base 21, and extends from the base 21 in the radial direction r. The disc portion 22 has a circular plate shape as viewed in the vertical direction z, for example. For example, the disc portion 22 is made of a metal such as stainless steel.

Drive Unit 3

The drive unit 3 has a drive function for raising and lowering the stage 2. In the present embodiment, the drive unit 3 also has a drive function for rotating the cup 1. The specific configuration of the drive unit 3 is not particularly limited. In the present embodiment, the drive unit 3 includes a lifting shaft 31, a support 32, a bellows member 33, a lifting drive mechanism 34, and a rotation drive mechanism 35.

The lifting shaft 31 has an upper end fixed to the base 21 of the stage 2, and raises and/or lowers the stage 2 in the vertical direction z. The lifting shaft 31 passes through the opening in the bottom surface 13 of the cup 1, and extends downward in the vertical direction z.

The support 32 is attached to the opening in the bottom surface 13 of the cup 1. The lifting shaft 31 is inserted into the support 32. When the support 32 is rotated about the lifting shaft 31, the cup 1 and the stage 2 are rotated together. The bellows member 33 is also rotated with the cup 1 and the stage 2. The lifting shaft 31 may also be rotated with the cup 1 and the stage 2. In some examples, the drive unit 3 may be specifically configured to rotate the cup 1 and the stage 2 separately.

The bellows member 33 has a bellows structure capable of expanding and contracting in the vertical direction z. The material of the bellows member 33 is not particularly limited, and may be a metal such as stainless steel or resin. The bellows member 33 has an upper end attached to the base 21 of the stage 2, and a lower end attached to the support 32. The interior of the bellows member 33 is hermetically partitioned from outside between the base 21 and the support 32.

The lifting drive mechanism 34 raises and lowers the lifting shaft 31. The specific configuration of the lifting drive mechanism 34 is not particularly limited. For example, the lifting drive mechanism 34 may be configured with a motor or a cylinder as appropriate. Although the lifting drive mechanism 34 is connected to the lower end of the lifting shaft 31 in the illustrated example, the position at which the lifting drive mechanism 34 is arranged is not particularly limited.

The rotation drive mechanism 35 rotates the cup 1 and the stage 2 about the lifting shaft 31. The specific configuration of the rotation drive mechanism 35 is not particularly limited. For example, the rotation drive mechanism 35 may be configured with a motor or a gear as appropriate. Although the rotation drive mechanism 35 rotates the cup 1 and the stage 2 via the support 32 in the illustrated example, the configuration of the rotation drive mechanism 35 is not particularly limited. For example, the rotation drive mechanism 35 may be configured to rotate the cup 1 directly. Although the rotation drive mechanism 35 is arranged on a side of the support 32 in the illustrated example, the position at which the rotation drive mechanism 35 is arranged is not particularly limited. The speed at which the cup 1 and the stage 2 are rotated by the rotation drive mechanism 35 may be set such that the processing solution 92 stored in the cup 1 is drained sufficiently by the centrifugal force generated as a result of the rotation of the cup 1.

Mount 4

The mount 4 is provided on the stage 2, and is where the substrate 91 is mounted. The specific configuration of the mount 4 is not particularly limited. In the illustrated example, the mount 4 has a plurality of blocks 41. The blocks 41 are fixed on the disc portion 22 of the stage 2, and arranged at an equal pitch in the circumferential direction θ. In the illustrated example, the four blocks 41 are arranged at a pitch of 90°. However, this is merely an example, and the number of blocks 41 and the range of the pitch are not particularly limited. The shape and material of each block 41 are not particularly limited. Preferably, the material of each block 41 is one that supports the substrate 91 appropriately, and that does not cause unnecessary reaction or damage with respect to the substrate 91. An example of such a material is resin.

As shown in FIGS. 2 and 3, each of the blocks 41 has a mounting surface 411. The mounting surface 411 is a flat surface facing upward in the vertical direction z. The position and shape of the mounting surface 411 are not particularly limited. In the illustrated example, the mounting surface 411 is located above the base 21 in the vertical direction z, and is designed such that, during a process (described below) for the substrate 91, the substrate 91 mounted on the mounting surface 411 will be positioned lower than the surface of the processing solution 92 stored in the cup 1. Furthermore, in the illustrated example, the size of the mounting surface 411 is designed to be sufficient for supporting a portion of the substrate 91 near the outer circumferential end.

Pivoting Member 5

The pivoting member 5 is pivotally attached to the mount 4 (blocks 41). The number of pivoting members 5 is not particularly limited. In the illustrated example, four pivoting members 5 are provided so as to correspond to the four blocks 41. The pivoting member 5 includes a pivoting shaft 51, a holding portion 52, and an abutting portion 53.

The pivoting shaft 51 is a shaft along the circumferential direction θ, and is constituted of a bolt, a shaft, or the like. The pivoting shaft 51 being a shaft along the circumferential direction θ refers to a shaft that is along the tangential direction of a circle having the lifting shaft 31 as a center, and does not mean that the pivoting shaft 51 is curved in an arc. The pivoting shaft 51 is fixed to a block 41.

The holding portion 52 is positioned more inward than the pivoting shaft 51 in the radial direction r. The abutting portion 53 is positioned more outward than the pivoting shaft 51 in the radial direction r. The specific configurations of the holding portion 52 and the abutting portion 53 are not particularly limited. In the illustrated example, the size of the abutting portion 53 in the radial direction r is larger than the size of the holding portion 52 in the radial direction r. The holding portion 52 and the abutting portion 53 may be configured as a single integral member, or may be configured as a plurality of members assembled together. In the illustrated example, the pivoting member 5 includes a main body 50, an extending portion 531, and a protrusion 532.

The main body 50 is a member through which the pivoting shaft 51 passes, and has a substantially rectangular shape elongated in the radial direction r as viewed in the vertical direction z. The material of the main body 50 is not particularly limited. For example, the main body 50 is made of resin. The holding portion 52 is a portion of the main body 50 located more inward than the pivoting shaft 51 in the radial direction r. In the illustrated example, the holding portion 52 includes a projection 521. The projection 521 is a portion of the upper section of the holding portion 52 in the vertical direction z, and projects inward in the radial direction r. The projection 521 is a member for creating a predetermined gap between the projection 521 and the mounting surface 411.

The abutting portion 53 is made up of a portion of the main body 50 that is located more outward than the pivoting shaft 51 in the radial direction r, the extending portion 531, and the protrusion 532. The extending portion 531 is attached to the lower end surface of the main body 50 in the vertical direction z, and extends outward as a whole from the main body 50 in the radial direction r. The shape and material of the extending portion 531 are not particularly limited. In the illustrated example, the extending portion 531 is made of a metal such as stainless steel, and has a bent shape having a first extending portion 5311, a second extending portion 5312, and an inclined portion 5313.

The first extending portion 5311 is attached to the lower end surface of the main body 50, and extends outward along the lower end surface in the radial direction r. As described below, when the stage 2 is located at the lowermost position as shown in FIGS. 6 and 7, the first extending portion 5311 extends in the radial direction r.

The second extending portion 5312 is positioned more outward than the first extending portion 5311 in the radial direction r. In the state shown in FIGS. 6 and 7, the second extending portion 5312 is positioned more upward than the first extending portion 5311 in the vertical direction z. The second extending portion 5312 extends in the same direction as the first extending portion 5311. In the state shown in FIGS. 6 and 7, the second extending portion 5312 extends in the radial direction r. An adjustment portion 5314 is formed on the second extending portion 5312. The adjustment portion 5314 is a portion to which the protrusion 532 is coupled.

The inclined portion 5313 is located between the first extending portion 5311 and the second extending portion 5312. In the state shown in FIGS. 6 and 7, the inclined portion 5313 is inclined such that the inclined portion 5313 is positioned more upward in the vertical direction z as it extends outward in the radial direction r. In this state, the inclined portion 5313 is designed to be parallel to the side surface 12 with a gap therebetween.

The protrusion 532 is coupled to the adjustment portion 5314 arranged on the second extending portion 5312, thus allowing the movement control of the protrusion 532 relative to the extending portion 531 in the direction indicated by the arrow in FIG. 3. The specific configurations of the protrusion 532 and the adjustment portion 5314 are not particularly limited. In one possible configuration, the protrusion 532 is held against the extending portion 531, and the position of the protrusion 532 is adjustable relative to the extending portion 531 by, for example, a predetermined user operation, so that the amount by which the protrusion 532 protrudes from the extending portion 531 can be adjusted. The coupling between the protrusion 532 and the adjustment portion 5314 as described above can be realized by the form of screwing described below. Furthermore, the movement control of the protrusion 532 may be realized by a configuration in which one of the protrusion 532 and the adjustment portion 5314 clamps the other, with the clamping force being adjustable. Alternatively, the coupling between the protrusion 532 and the adjustment portion 5314 can be realized with a magnetic force.

In the illustrated example, the protrusion 532 is configured with a member having a male thread, such as a fixing screw with a hexagonal hole. The adjustment portion 5314 has a female thread, and may be configured with a hexagonal nut fixed to a metal plate member that constitutes the extending portion 531. As a result, the protrusion 532 and the adjustment portion 5314 are coupled to each other by screwing. The adjustment portion 5314 having a female thread may be provided by forming a female thread hole in the metal plate member per se that constitutes the extending portion 531. In the state shown in FIGS. 6 and 7, the lower end of the protrusion 532 in the vertical direction z protrudes downward in the vertical direction z from the second extending portion 5312.

Drainage Chamber 6

The drainage chamber 6 is where the processing solution 92 used for a process is drained from the cup 1. The specific configuration of the drainage chamber 6 is not particularly limited. Furthermore, the substrate processing apparatus according to the present invention may be configured without a component such as the drainage chamber 6 that receives the processing solution 92 drained from the cup 1. In the present embodiment, the drainage chamber 6 is made of a metal plate, such as a stainless steel plate, and includes an upper plate 61, a lower plate 62, an inner plate 63, and a drainage path 64.

The upper plate 61 is located upward in the vertical direction z, and has an annular shape in the illustrated example. The upper plate 61 is located above the upper end 11 of the cup 1 in the vertical direction z. As viewed in the vertical direction z, the upper plate 61 overlaps with the upper end 11. As viewed in the vertical direction z, the stage 2 is located inside the upper plate 61.

The lower plate 62 is located below the upper plate 61 in the vertical direction z, and has an annular shape as viewed in the vertical direction z, for example. The lower plate 62 is shaped and sized to substantially overlap with the upper plate 61, as viewed in the vertical direction z. The lower plate 62 is located below the lower end of the outer wall 14 in the vertical direction z.

The inner plate 63 extends upward in the vertical direction z from the inner edge of the lower plate 62 in the radial direction r, and has a cylindrical shape. As viewed in the vertical direction z, the inner plate 63 is located between the side surface 12 and the outer wall 14 of the cup 1, and overlaps with the upper end 11. The lower end of the inner plate 63 is located below the lower end of the outer wall 14 in the vertical direction z. The upper end of the inner plate 63 is located above the lower end of the outer wall 14 and below the upper plate 61 in the vertical direction z. In other words, the outer wall 14 and the inner plate 63 partially overlap with each other as viewed from outside in the radial direction r.

The drainage path 64 is a flow path that guides the processing solution 92 drained from the cup 1 to a predetermined location. In the illustrated example, the drainage path 64 extends outward in the radial direction r from the annular space surrounded by the upper plate 61, the lower plate 62, and the inner plate 63.

The following describes the operation of the substrate processing apparatus A1.

FIG. 2 shows the state when a process for the substrate 91 is started. In this state, the stage 2 is raised by the lifting drive mechanism 34 of the drive unit 3, and is located at the uppermost position in the vertical direction z. The pivoting member 5 is pivotally supported by the mount 4, and is not in contact with, for example, the cup 1. Since the abutting portion 53 is larger than the holding portion 52 in the radial direction r, the abutting portion 53 is located downward in the vertical direction z and the holding portion 52 is located upward in the vertical direction z due to the balance of gravity. In this state, the holding portion 52 of the pivoting member 5 does not overlap with the mounting surface 411 of the mount 4 as viewed in the vertical direction z, and is located more outward than the mounting surface 411 in the radial direction r.

Next, the substrate 91 is placed as shown in FIG. 4. To place the substrate 91, the substrate 91 is lowered from above in the vertical direction z by, for example, a non-illustrated holder. Then, as shown in FIG. 3, the substrate 91 is placed by allowing a portion of the substrate 91 near its outer circumferential end to abut against the mounting surface 411 of the mount 4.

Next, the stage 2 is lowered in the vertical direction z by the lifting drive mechanism 34 of the drive unit 3. As a result, the mount 4, the pivoting member 5, and the substrate 91 are lowered together with the stage 2 relative to the cup 1. As the stage 2 is lowered, the upper end 11 and the protrusion 532 of the pivoting member 5 that are spaced apart from each other as shown in FIGS. 3 and 4 come into contact with each other as shown in FIG. 5. This contact may be achieved by either the abutment of the lower end of the protrusion 532 or the abutment of the outer end of the second extending portion 5312 in the radial direction r. As the stage 2 is further lowered from this state, the pivoting shaft 51 of the pivoting member 5 is lowered but the protrusion 532 is prevented from being lowered by the upper end 11. As a result, the pivoting member 5 pivots about the pivoting shaft 51 (clockwise in the example of FIG. 5).

FIGS. 6 and 7 show the state where the lowering of the stage 2 is completed, and the stage 2 is located at the lowermost position in the vertical direction z. From the state shown in FIG. 5 onward, the stage 2, the mount 4, and the substrate 91 are lowered with the protrusion 532 abutting against the upper end 11 of the cup 1. Accordingly, the pivoting shaft 51 pivots so that the substrate processing apparatus A1 is in the state shown in FIGS. 6 and 7. In this state, the first extending portion 5311 and the second extending portion 5312 extend in the radial direction r. The inclined portion 5313 is parallel to the side surface 12 with a gap therebetween. The second extending portion 5312 is parallel to the upper end 11 with a gap therebetween.

The pivoting of the pivoting member 5 associated with the lowering of the stage 2 to the state shown in FIGS. 6 and 7 reduces the distance between the projection 521 of the holding portion 52 and the mounting surface 411 of the mount 4. In this operation, a portion of the substrate 91 is located between the projection 521 and the mounting surface 411. Accordingly, when the stage 2 reaches the lowermost position, the distance between the projection 521 and the mounting surface 411 becomes smallest with the substrate 91 therebetween. At this point, the projection 521 may be in contact with the substrate 91, or may be separated from the substrate 91 with a small gap.

Next, the processing solution 92 is poured into the cup 1. In the present embodiment, a nozzle 82 may be used to pour the processing solution 92 into the cup 1, as shown in FIG. 8. The type and other characteristics of the processing solution 92 are not particularly limited, and are selected appropriately according to a process performed on the substrate 91.

When a lift-off process is performed on the substrate 91, two types of liquids may be selected in sequence as the processing solution 92. A first type of the processing solution 92 is an insoluble liquid that is not soluble to the resist layer. The insoluble liquid may be pure water. For example, pure water, which is an insoluble liquid, is selected as the processing solution 92 and poured from the nozzle 82 into the cup 1. The amount of processing solution 92 to be poured is set such that the substrate 91 mounted on the mount 4 is sufficiently immersed in the processing solution 92. In this case, the surface of the processing solution 92 is located above the substrate 91 in the vertical direction z. In the illustrated example, the surface of the processing solution 92 is located above the entirety of the blocks 41 and the entirety of the main body 50 of the pivoting member 5 in the vertical direction z. On the other hand, the extending portion 531 of the abutting portion 53 extends beyond the surface of the processing solution 92 and protrudes upward from the processing solution 92.

After the processing solution 92, which is an insoluble liquid, is poured into the cup 1, an ultrasonic wave generator 81, for example, is used to apply ultrasonic waves to the substrate 91 via the processing solution 92. The specific configuration of the ultrasonic wave generator 81 is not particularly limited. For example, the ultrasonic wave generator 81 may be a horn-type ultrasonic wave generator. For example, the ultrasonic waves from the ultrasonic wave generator 81 cause most of the metal layer stacked on the resist layer and a portion of the resist layer to be peeled off from the substrate 91. When ultrasonic waves are applied to the substrate 91, it is preferable, for example, to reciprocate the ultrasonic wave generator 81 in the radial direction r as shown by the arrow in the figure. Furthermore, along with the reciprocation of the nozzle 82 in the radial direction r, it is preferable to rotate the stage 2, the mount 4, the pivoting member 5, and the substrate 91 at low speed in the circumferential direction θ. This makes it possible to apply ultrasonic waves from the ultrasonic wave generator 81 to the entire surface of the substrate 91.

When the ultrasonic wave generator 81 applies ultrasonic waves, most of the metal layer and a portion of the resist layer to be removed float on or sink in the processing solution 92. Then, the processing solution 92 is drained from the cup 1. In the present embodiment, the processing solution 92 is drained by the use of the centrifugal force generated by the rotation of the cup 1 about the lifting shaft 31.

As shown in FIG. 9, the support 32 is rotated by the rotation drive mechanism 35 of the drive unit 3. This causes the rotation of the cup 1. The rotation speed at this point is required to be a speed that allows the processing solution 92 in the cup 1 to be sufficiently drained, and is remarkably faster than, for example, the rotation speed in the process of applying ultrasonic waves by the use of the ultrasonic wave generator 81. Due to the centrifugal force generated by the rotation of the cup 1, the processing solution 92 flows along the side surface 12 of the cup 1, outward in the radial direction r and upward in the vertical direction z. As a result, the processing solution 92 flows across the upper end 11, and is drained sequentially to the outside of the cup 1 in the radial direction r.

The processing solution 92 drained from the cup 1 passes through the gap between the upper end 11 and the upper plate 61 and falls to the lower plate 62. Then, the processing solution 92 passes through the drainage path 64, and flows out to a predetermined location for a waste solution. At this point, since the outer wall 14 of the cup 1 and the inner plate 63 of the drainage chamber 6 overlap with each other as viewed from outside in the radial direction r, it is possible to suppress scattering of the processing solution 92 to the area in which the support 32, the lifting drive mechanism 34, and the rotation drive mechanism 35 are arranged. In the present embodiment, the mount 4, the pivoting member 5, and the substrate 91 are configured to rotate together with the cup 1. However, the present invention is not limited to this, and only the cup 1 may be configured to rotate at high speed when the processing solution 92 is drained.

When the draining of the insoluble liquid as the processing solution 92 is completed, a second type of the processing solution 92, which is a soluble liquid that is soluble to the resist layer, is poured into the cup 1 in the present example. An example of such a type of the processing solution 92 is isopropyl alcohol (IPA). When pouring the processing solution 92 that is a soluble liquid, it is preferable to spray the processing solution 92 onto the substrate 91. In this way, the resist layer remaining on the surface of the substrate 91 is dissolved by the processing solution 92 that is a soluble liquid. After the dissolution of the remaining resist layer by the processing solution 92 is completed, the processing solution 92 is drained by the use of the centrifugal force generated by the rotation of the cup 1 in the same manner as the one described with reference to FIG. 9.

After the draining of the processing solution 92 is completed, the stage 2 is raised to the uppermost position by the lifting drive mechanism 34. Thus, the stage 2 returns to the state shown in FIGS. 3 and 4. Subsequently, the substrate 91 is lifted off from the mount 4 by a predetermined holder or the like (not shown). This completes the lift-off process for the substrate 91. Note that after the processing solution 92 is drained and before the stage 2 is raised, a predetermined gas may be sprayed onto the substrate 91, for example, in order to dry the processing solution 92 remaining on the substrate 91.

The following describes the advantages of the substrate processing apparatus A1.

According to the present embodiment, as the stage 2 is lowered, the abutting portion 53 of the pivoting member 5 abuts against the cup 1, causing the pivoting member 5 to rotate and hold the substrate 91. As a result, there is no need to provide the cup 1 with an abutting member that abuts against the pivoting member 5. This makes it possible to prevent the abutting member from unduly disturbing the flow of the processing solution 92 in the cup 1. In another case, it is possible to prevent the resist layer and the metal layer removed by the lift-off process from adhering to the abutting member. Thus, it is possible to reduce unintended effects on a process for the substrate 91.

In the substrate processing apparatus A1, the cup 1 is rotated to drain the processing solution 92 from the cup 1, as shown in FIG. 9. In an example different from the present embodiment, such as the case described in Patent document 1 where the processing solution 92 is drained from a drain port provided in the bottom surface 13 of the cup 1, the chips or powder of the metal layer and the resist layer floating on the processing solution 92 may be adhered again to the upper surface of the substrate 91 and remain. According to the present embodiment, the processing solution 92 is drained outward in the radial direction r by the use of the centrifugal force generated by the cup 1. Accordingly, the chips or powder of the metal layer and the resist layer contained in the processing solution 92 are thrown outward in the radial direction r together with the processing solution 92. This makes it possible to prevent the chips or powder of the metal layer and the resist layer from remaining on the substrate 91. Furthermore, unlike Patent document 1, there is no need of extra processing works such as providing a drain port for the cup 1 or joining an abutting member, which makes it possible to simplify the apparatus.

The side surface 12 of the cup 1 is tapered and inclined. Accordingly, when the cup 1 is rotated to drain the processing solution 92, the processing solution 92 flows obliquely upward along the side surface 12 and beyond the upper end 11 to drain more smoothly. As shown in FIG. 7, when the processing solution 92 is drained, the inclined portion 5313 of the extending portion 531 of the pivoting member 5 is set in parallel to the side surface 12 with a gap therebetween, thus allowing the processing solution 92 to flow smoothly through the gap between the side surface 12 and the inclined portion 5313 and drain appropriately.

As shown in FIGS. 5 to 7, the abutting portion 53 of the pivoting member 5 abuts against the upper end 11 of the cup 1 to cause the pivoting of the pivoting member 5. This avoids situations where smooth pivoting of the pivoting member 5 is hindered or pivoting of the pivoting member 5 becomes irregular as a result of the pivoting member 5 and the cup 1 rubbing strongly against each other after the abutting portion 53 of the pivoting member 5 abuts against the upper end 11 and also when the stage 2 is lowered.

The abutting portion 53 includes the protrusion 532, and the protrusion 532 abuts against the upper end 11. The protrusion 532 is attached to the extending portion 531 by screwing and is movable relative to the extending portion 531. This makes it possible to, for example, adjust the position of the protrusion 532 relative to the extending portion 531, so that in the state shown in FIGS. 6 and 7, the distance between the projection 521 of the holding portion 52 and the mounting surface 411 of the mount 4 is suitably set for holding the substrate 91. Once the positional adjustment of the protrusion 532 is completed, the distance between the projection 521 of the holding portion 52 and the mounting surface 411 of the mount 4 can be appropriately set with excellent reproducibility in the subsequent operations of the substrate processing apparatus A1. This is suitable for preventing the aforementioned distance from being varied every time the substrate processing apparatus A1 is activated to perform operations. Furthermore, even if the upper end 11 of the cup 1 suffers from deformation or the like due to long-term use, the position of the protrusion 532 can be adjusted to hold the substrate 91 properly.

With the bellows member 33 provided in the cup 1, it is possible to prevent the processing solution 92 from adhering to, for example, the lifting shaft 31, even when the processing solution 92 is stored in the cup 1.

FIGS. 10 to 17 show other embodiments of the present invention. In these figures, elements that are the same as or similar to the elements in the above embodiment are provided with the same reference numerals as those in the above embodiment.

Second Embodiment

FIGS. 10 to 15 show a substrate processing apparatus according to a second embodiment of the present invention.

Figure 10:
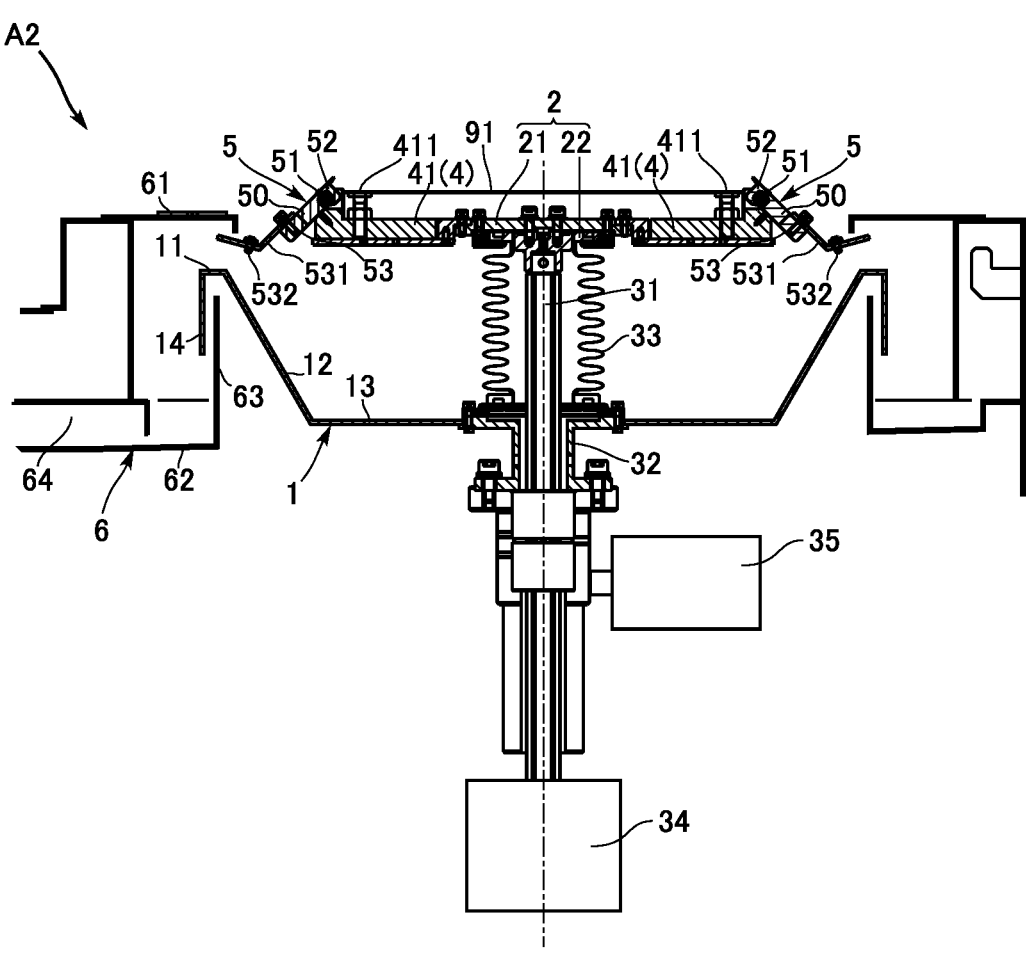
FIG. 10 is a partial cross-sectional view showing a substrate processing apparatus according to a second embodiment of the present invention.
Figure 10:
Figure 11:
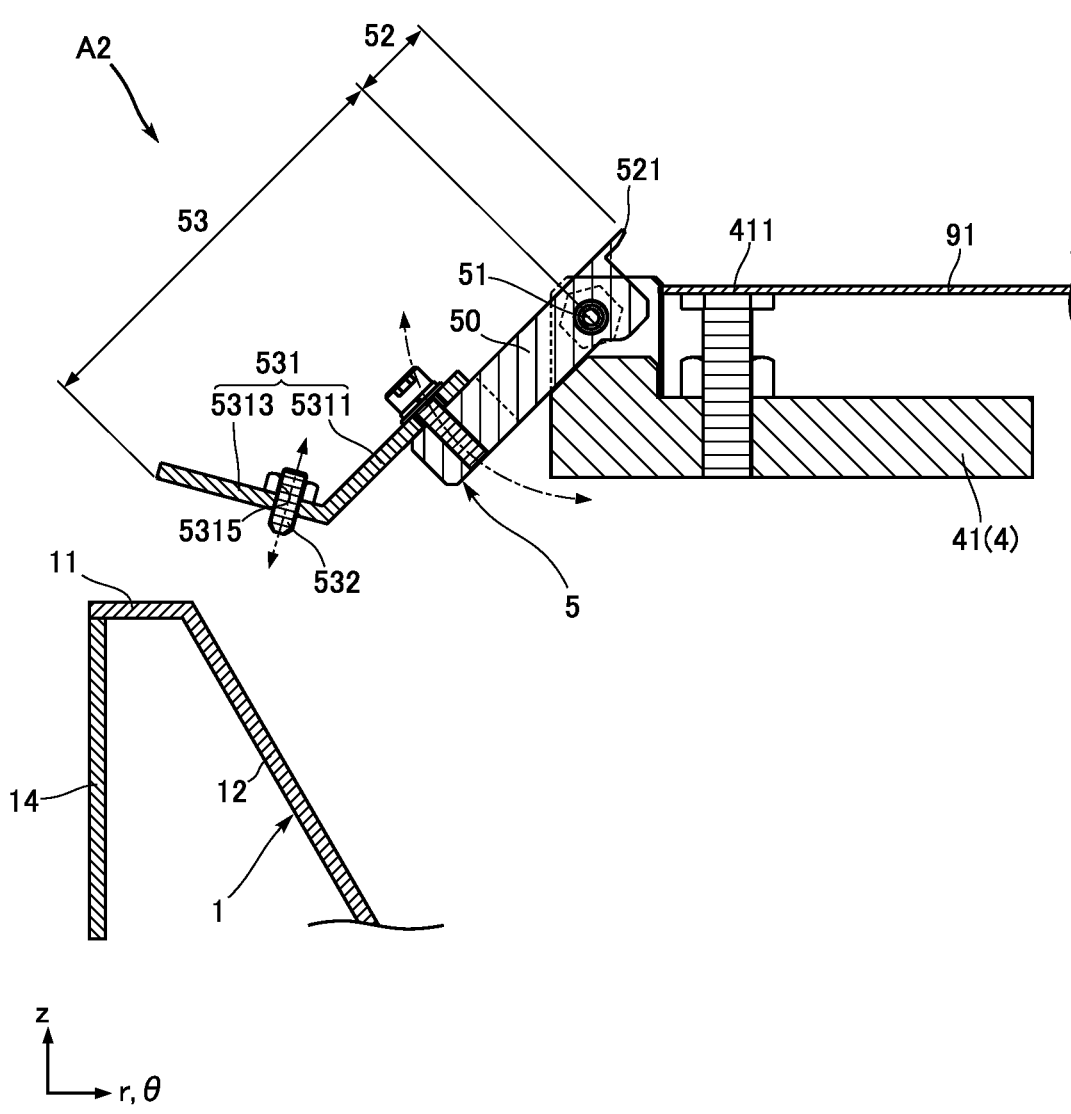
FIG. 11 is a partially enlarged cross-sectional view showing the substrate processing apparatus according to the second embodiment of the present invention.
Figure 12:
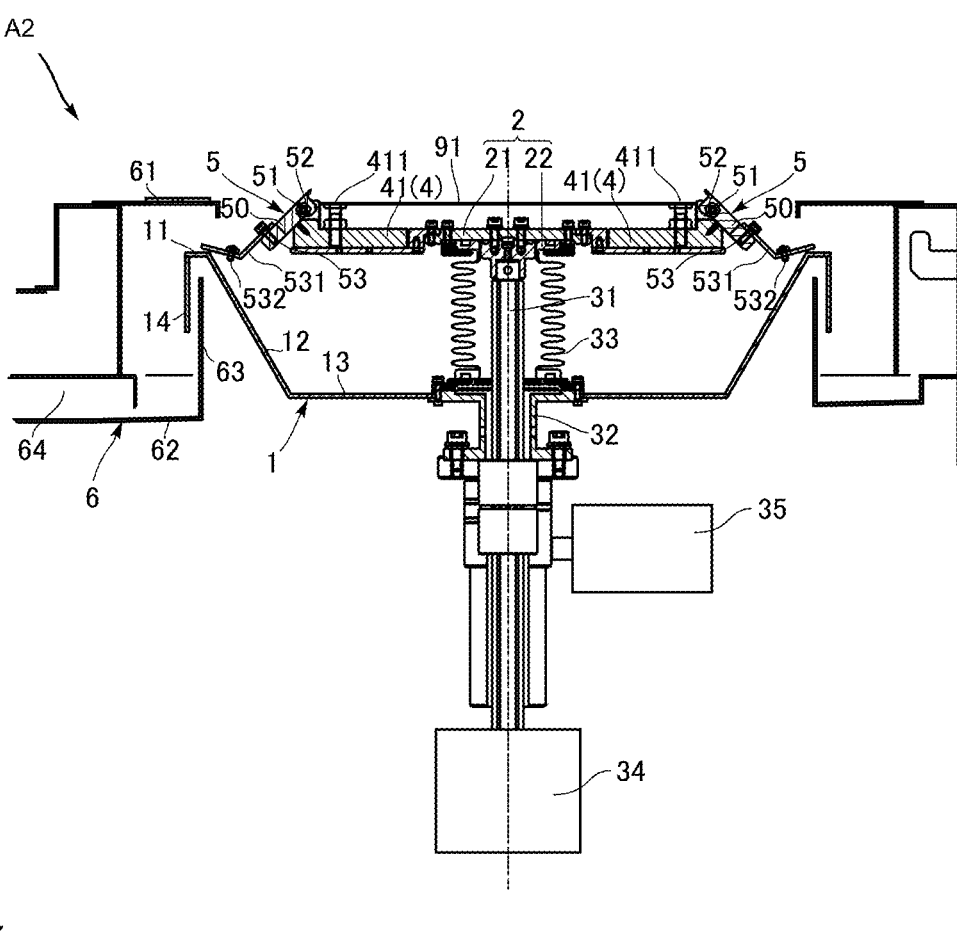
FIG. 12 is a partial cross-sectional view showing an operation of the substrate processing apparatus according to the second embodiment of the present invention.
Figure 12:
Figure 13:
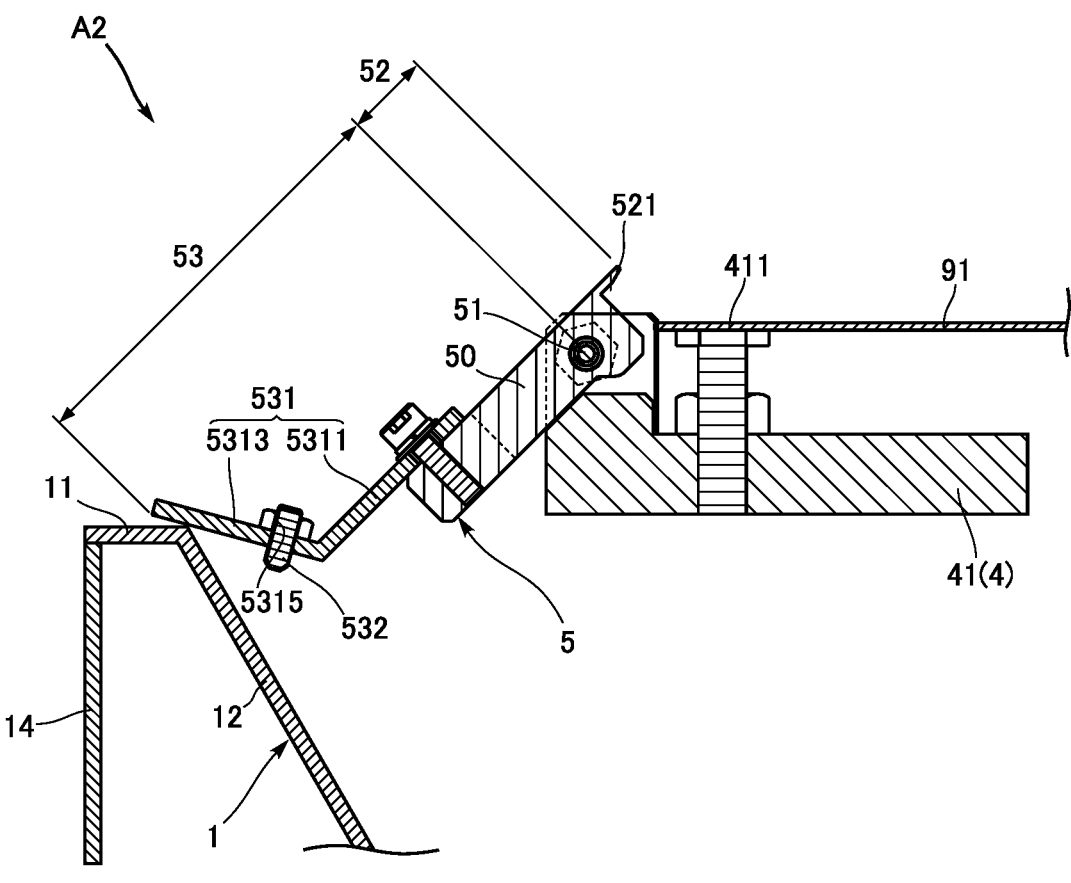
FIG. 13 is a partially enlarged cross-sectional view showing an operation of the substrate processing apparatus according to the second embodiment of the present invention.
Figure 13:
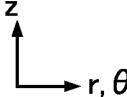
Figure 14:
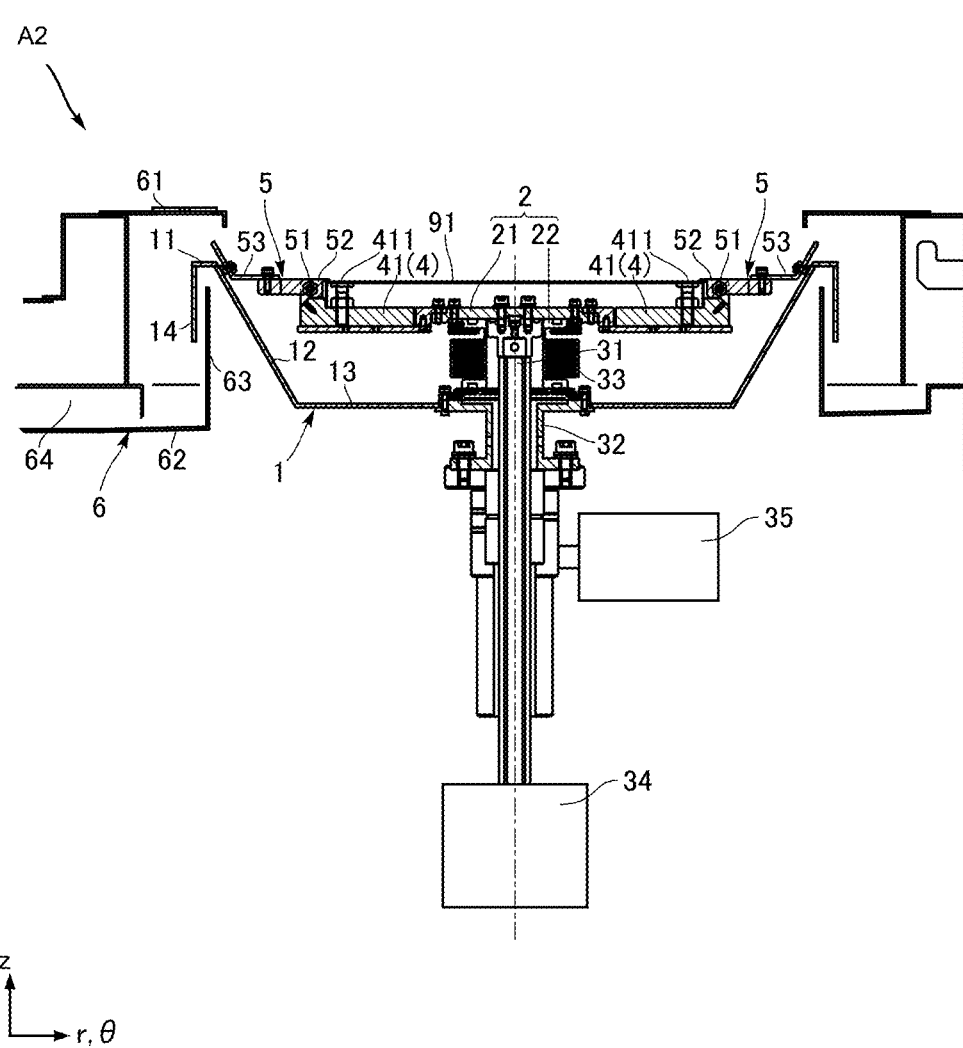
FIG. 14 is a partial cross-sectional view showing an operation of the substrate processing apparatus according to the second embodiment of the present invention.
Figure 15:
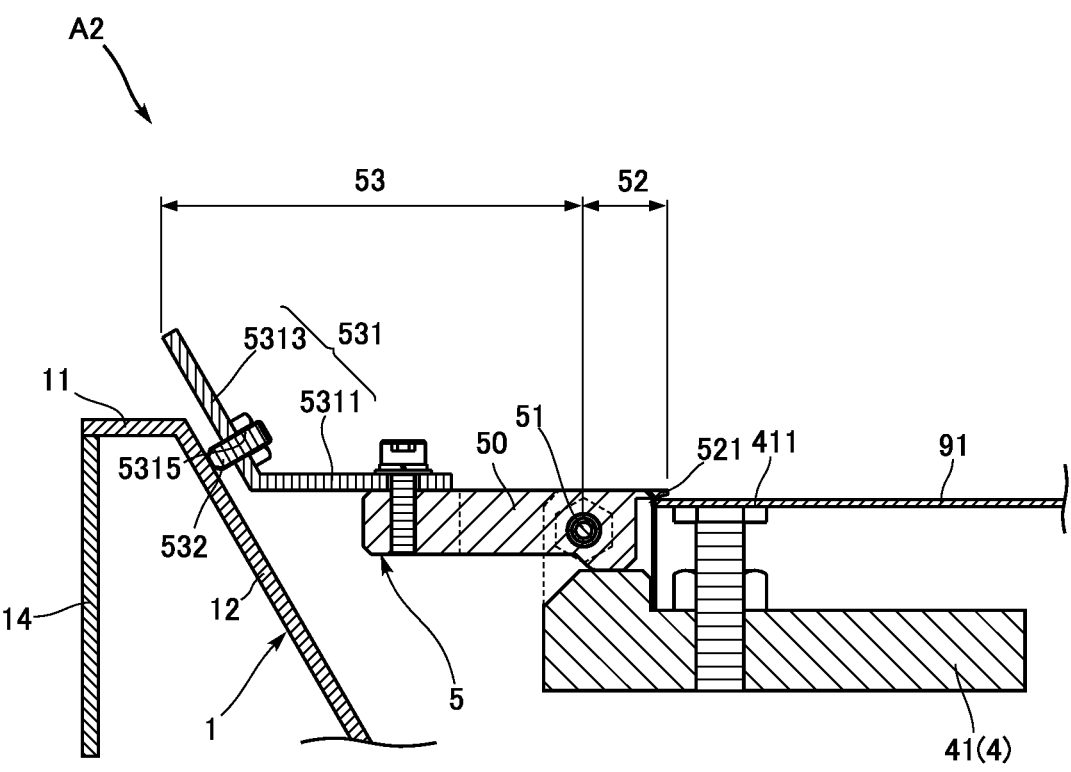
FIG. 15 is a partially enlarged cross-sectional view showing an operation of the substrate processing apparatus according to the second embodiment of the present invention.
Figure 15:
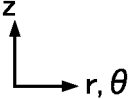

A substrate processing apparatus A2 according to the present embodiment is different from the substrate processing apparatus A1 mainly in the configuration of the pivoting member 5. FIGS. 10 and 11 show the substrate processing apparatus A2 in the same state as in FIGS. 2 and 3. FIGS. 14 and 15 show the substrate processing apparatus A2 in the same state as in FIGS. 6 and 7. FIGS. 12 and 13 show the substrate processing apparatus A2 in the state between the state shown in FIGS. 10 and 11 and the state shown in FIGS. 14 and 15.

In the pivoting member 5 of the substrate processing apparatus A2, the extending portion 531 is attached to the upper end surface of the main body 50. The extending portion 531 includes the first extending portion 5311 and the inclined portion 5313, but does not include the second extending portion 5312.

The first extending portion 5311 extends outward along the upper end surface of the main body 50 in the radial direction r. In the state shown in FIGS. 14 and 15, the first extending portion 5311 extends outward in the radial direction r.

The inclined portion 5313 extends outward in the radial direction r from the outer end of the first extending portion 5311 in the radial direction r. In the state shown in FIGS. 14 and 15, the inclined portion 5313 is inclined such that the inclined portion 5313 is positioned more upward in the vertical direction z as it extends outward in the radial direction r from the outer end of the first extending portion 5311. In this state, the inclined portion 5313 is designed to be parallel to the side surface 12 with a gap therebetween.

In the present embodiment, the inclined portion 5313 is provided with an adjustment portion 5315, and the protrusion 532 is coupled to the adjustment portion 5315 by screwing. The adjustment portion 5315 is configured with a hexagonal nut fixed to a metal plate member that constitutes the extending portion 531. Note that the adjustment portion 5315 may be provided by forming a female thread hole in the metal plate member per se that constitutes the extending portion 531. As with the adjustment portion 5314 described above, the configuration of the adjustment portion 5315 is not particularly limited.

The adjustment portion 5315 is arranged at a position more inward in the radial direction r than the position of the adjustment portion 5314 in the pivoting member 5 of the substrate processing apparatus A1 in the radial direction r. In other words, in the pivoting member 5 of the substrate processing apparatus A2, the inclined portion 5313 extends greatly from the protrusion 532 to the outside in the radial direction r. In the state shown in FIGS. 10 and 11, the inclined portion 5313 partially overlaps with the upper end 11 as viewed in the vertical direction z. On the other hand, as viewed in the vertical direction z, the protrusion 532 is located more inward than the upper end 11 in the radial direction r and overlaps with the side surface 12.

The substrate processing apparatus A2 also performs operations similar to those described in connection with the substrate processing apparatus A1, in order to perform a process for the substrate 91. When the substrate 91 is mounted on the mount 4, the stage 2, the mount 4, the pivoting member 5, and the substrate 91 are lowered relative to the cup 1 by the rotation drive mechanism 35. As a result, as shown in FIGS. 12 and 13, the inclined portion 5313 abuts against the upper end 11 (or the boundary between the upper end 11 and the side surface 12). When the stage 2, the mount 4, and the substrate 91 are further lowered from this state, the pivoting member 5 pivots about the pivoting shaft 51 with the inclined portion 5313 abutting against the upper end 11 (or the boundary between the upper end 11 and the side surface 12).

When the stage 2, the mount 4, and the substrate 91 are further lowered to reach the lowermost position as shown in FIGS. 14 and 15, the protrusion 532 abuts against the side surface 12 while the inclined portion 5313 is spaced apart from the upper end 11. In other words, in the course of the lowering from the state shown in FIGS. 12 and 13 to the state shown in FIGS. 14 and 15, the inclined portion 5313 and the upper end 11 (or the boundary between the upper end 11 and the side surface 12) abut against each other, and the protrusion 532 and the side surface 12 abut against each other. Then, the inclined portion 5313 immediately separates from the upper end 11, and the protrusion 532 and the side surface 12 abut against each other. In this state, the stage 2 and the other components are lowered to be placed in the state shown in FIGS. 14 and 15. In the state shown FIGS. 14 and 15, the distance between the projection 521 and the mounting surface 411 is the smallest with the substrate 91 interposed therebetween.

The present embodiment can also reduce unintended effects on a process for the substrate 91. Furthermore, in the present embodiment, the pivoting of the pivoting member 5 starts as a result of the inclined portion 5313 abutting against the upper end 11 (or the boundary between the upper end 11 and the side surface 12) as shown in FIGS. 13 and 15. In the state where the stage 2 is lowered to the lowermost position, the protrusion 532 abuts against the side surface 12, which determines the distance between the projection 521 and the mounting surface 411. The abutment of the inclined portion 5313 against the upper end 11 can avoid situations where smooth pivoting of the pivoting member 5 is hindered or pivoting of the pivoting member 5 becomes irregular as a result of the inclined portion 5313 and the cup 1 rubbing strongly against each other when the pivoting member 5 pivots along with the subsequent lowering operation of the stage 2. The side surface 12 is tapered and cylindrical as a whole. The side surface 12 with such a configuration has high rigidity and is not easily deformed. Thus, the distance between the projection 521 and the mounting surface 411 can be more reliably set to a predetermined distance by the abutment of the protrusion 532.

Third Embodiment

Figure 16:
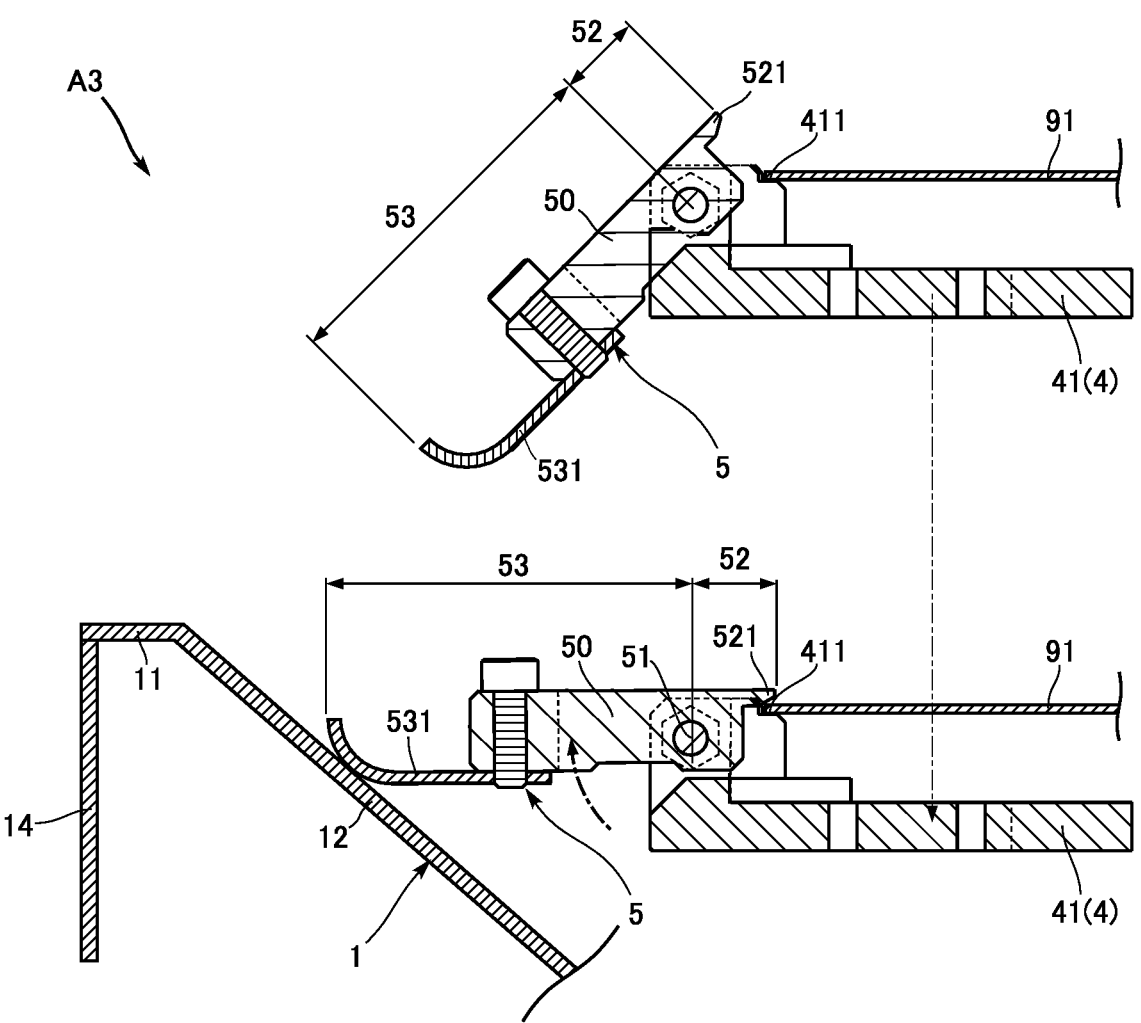
FIG. 16 is a partially enlarged cross-sectional view showing an operation of a substrate processing apparatus according to a third embodiment of the present invention.
Figure 16:
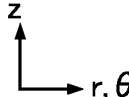

FIG. 16 shows a substrate processing apparatus according to a third embodiment of the present invention. According to a substrate processing apparatus A3 in the present embodiment, as the stage 2 is lowered, the abutting portion 53 abuts against the side surface 12, but does not abut against the upper end 11.

The abutting portion 53 of the present embodiment includes the extending portion 531. The extending portion 531 has a tip curved upward, for example. In the present embodiment, the angle formed by the side surface 12 and a horizontal plane is smaller than those in the substrate processing apparatuses A1 and A2, and may be approximately 40°, for example.

When the stage 2 is lowered from the uppermost position, the tip of the extending portion 531 abuts against the side surface 12. When the stage 2 is further lowered to the lowermost position, the main body 50 is aligned in the radial direction r to hold the substrate 91, as shown in the figure.

The present embodiment can also reduce unintended effects on a process for the substrate 91. As can be understood from the present embodiment, the abutting portion 53 of the pivoting member 5 in the present invention is suffi-
cient if it is configured to pivot by abutting against the cup
1. For example, the abutting portion 53 may abut against
only the side surface 12 and not the upper end 11. It is
possible to provide a protrusion and an adjustment portion in
the present embodiment.

Fourth Embodiment

Figure 17:
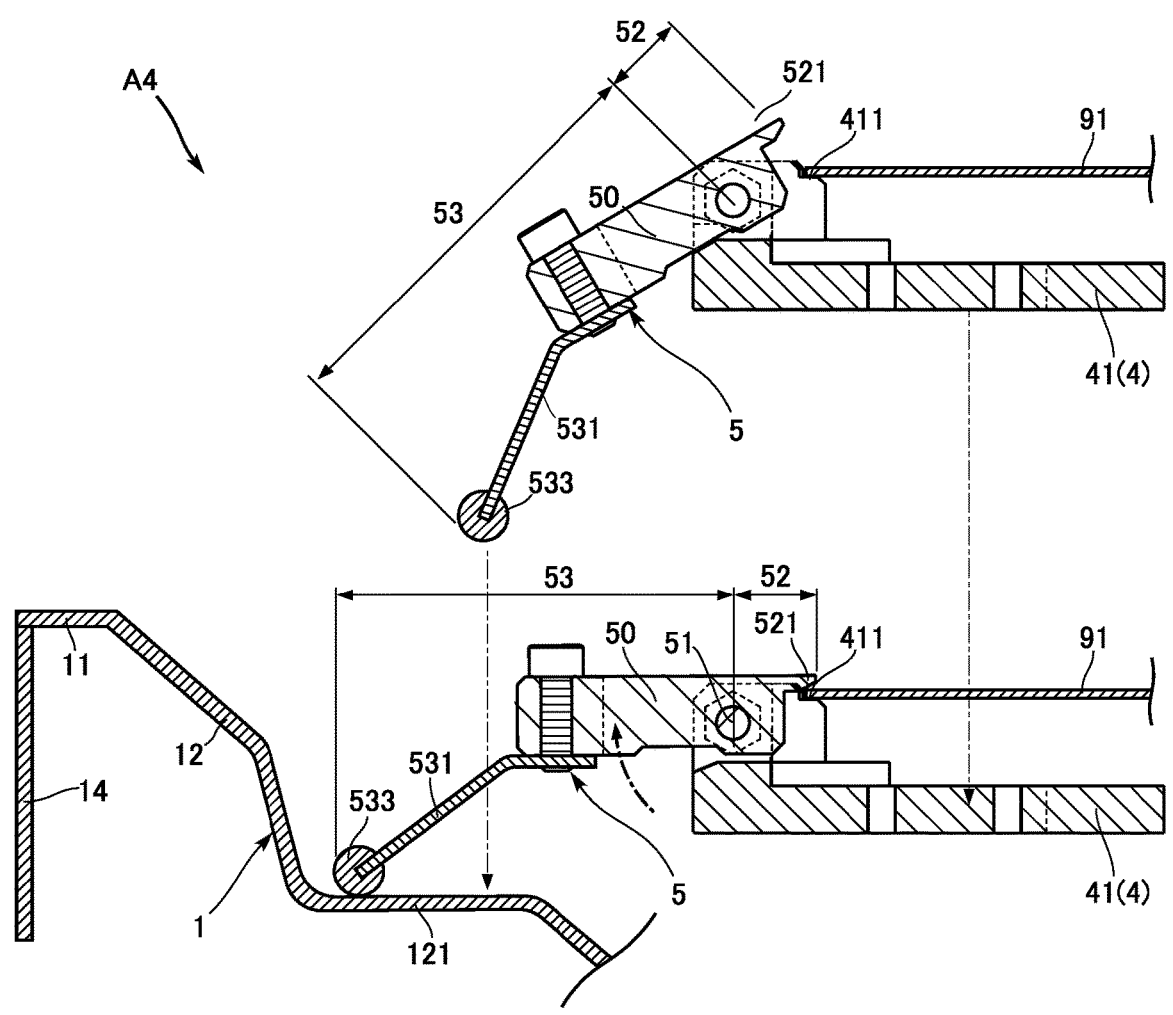
FIG. 17 is a partially enlarged cross-sectional view showing an operation of a substrate processing apparatus according to a fourth embodiment of the present invention.
Figure 17:
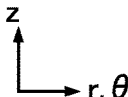

FIG. 17 shows a substrate processing apparatus according
to a fourth embodiment of the present invention. According
to a substrate processing apparatus A4 in the present
embodiment, the side surface 12 of the cup 1 is provided
with a flat region 121. The flat region 121 has a horizontal
surface, and is formed by bending or drawing a portion of
the side surface 12. When the stage 2 is located at the
lowermost position, the flat region 121 is below the substrate
91 and the pivoting shaft 51, and in the illustrated example,
is below the blocks 41.

In the pivoting member 5 of the present embodiment, the
abutting portion 53 includes the extending portion 531 and
a tip portion 533. In the illustrated example, the extending
portion 531 is bent obliquely downward from the main body
50. The tip portion 533 is attached to the tip of the extending
portion 531, and is preferably rotatable. When the stage 2 is
at the uppermost position, the tip portion 533 overlaps with
the flat region 121 as viewed in the vertical direction z. It is
possible to employ the protrusion and the adjustment portion
described above, instead of the tip portion 533.

In the present embodiment, when the stage 2 is lowered,
the tip portion 533 abuts against the flat region 121 of the
side surface 12. As a result, the pivoting member 5 pivots
about the pivoting shaft 51. When the stage 2 reaches the
lowermost position, the substrate 91 is held by the projection
521 of the pivoting member 5 and the mounting surface 411
of the mount 4.

The present embodiment can also reduce unintended
effects on a process for the substrate 91. As can be under-
stood from the present embodiment, the shape of the side
surface 12 is not particularly limited, and may be any shape
as long as it allows pivoting of the pivoting member 5 as a
result of the abutment of the abutting portion 53 of the
pivoting member 5. The cup 1 having the side surface 12
formed with the flat region 121 can also prevent undue
disturbance of the flow of the processing solution 92 in the
cup 1, and can also prevent the resist layer and the metal
layer removed by the lift-off process from adhering to the
abutting member, as compared to a conventional configu-
ration where an abutting member is provided in a cup.

The substrate processing apparatus according to the pres-
ent invention is not limited to the embodiments described
above. Various design changes can be made to the specific
configurations of the elements of the substrate processing
apparatus according to the present invention.

The invention claimed is:
1. A substrate processing apparatus comprising:
a cup capable of storing a processing solution for pro-
cessing a substrate;
a stage configured to be raised and lowered along a lifting
shaft extending in a vertical direction in the cup;
a mount provided on the stage and configured to mount
the substrate; and
a pivoting member pivotably attached to the mount such
that the pivoting member is pivotable about a pivoting
shaft provided along a circumferential direction cen-
tered at the lifting shaft,

wherein the pivoting member includes a holding portion
located inward of the pivoting shaft in a radial direc-
tion, and an abutting portion located outward of the
pivoting shaft in the radial direction so that at least a
part of the abutting portion protrudes outward of the
stage in the radial direction, the holding portion being
opposite to the abutting portion with respect to the
pivoting shaft, and
as the stage is lowered, the abutting portion abuts against
the cup to cause pivoting of the pivoting member,
thereby reducing a distance between the holding por-
tion and the mount with the substrate therebetween.
2. The substrate processing apparatus according to claim
1, wherein the cup rotates about the lifting shaft to drain the
processing solution outward in the radial direction.
3. The substrate processing apparatus according to claim
1, wherein the cup includes an upper end, a side surface
connected to the upper end, and a bottom surface connected
to a lower end of the side surface, and
as viewed in the vertical direction, an entirety of the
bottom surface is positioned inside the upper end.
4. The substrate processing apparatus according to claim
3, wherein the abutting portion abuts against the upper end.
5. The substrate processing apparatus according to claim
3, wherein the abutting portion abuts against the side sur-
face.
6. The substrate processing apparatus according to claim
4, wherein the abutting portion includes an extending por-
tion extending from the pivoting shaft, and a protrusion
coupled to an adjustment portion provided for the extending
portion, and
the protrusion abuts against the upper end.
7. The substrate processing apparatus according to claim
3, wherein the abutting portion includes an extending por-
tion extending from the pivoting shaft, and a protrusion
screwed to an adjustment portion provided for the extending
portion, and
as the stage is lowered, the extending portion abuts
against the upper end, and thereafter the protrusion
abuts against the side surface.
8. The substrate processing apparatus according to claim
1, wherein when the substrate is subjected to a process, a
surface of the processing solution is positioned above the
substrate.
9. The substrate processing apparatus according to claim
1, wherein the lifting shaft is covered with a bellows
member in the cup.
10. A substrate processing apparatus comprising:
a cup capable of storing a processing solution for pro-
cessing a substrate;
a stage configured to be raised and lowered along a lifting
shaft extending in a vertical direction in the cup;
a mount provided on the stage and configured to mount
the substrate; and
a pivoting member pivotably attached to the mount such
that the pivoting member is pivotable about a pivoting
shaft provided along a circumferential direction cen-
tered at the lifting shaft,
wherein the pivoting member includes a holding portion
located inward of the pivoting shaft in a radial direc-
tion, and an abutting portion located outward of the
pivoting shaft in the radial direction,
as the stage is lowered, the abutting portion abuts against
the cup to cause pivoting of the pivoting member,
thereby reducing a distance between the holding por-
tion and the mount with the substrate therebetween, the cup includes an upper end, a side surface connected to the upper end, and a bottom surface connected to a lower end of the side surface, as viewed in the vertical direction, an entirety of the bottom surface is positioned inside the upper end, and the abutting portion abuts against the upper end.

11. A substrate processing apparatus comprising:

a cup capable of storing a processing solution for processing a substrate;

a stage configured to be raised and lowered along a lifting shaft extending in a vertical direction in the cup;

a mount provided on the stage and configured to mount the substrate; and a pivoting member pivotably attached to the mount such that the pivoting member is pivotable about a pivoting shaft provided along a circumferential direction centered at the lifting shaft, wherein the pivoting member includes a holding portion located inward of the pivoting shaft in a radial direction, and an abutting portion located outward of the pivoting shaft in the radial direction, as the stage is lowered, the abutting portion abuts against the cup to cause pivoting of the pivoting member, thereby reducing a distance between the holding portion and the mount with the substrate therebetween, the cup includes an upper end, a side surface connected to the upper end, and a bottom surface connected to a lower end of the side surface, as viewed in the vertical direction, an entirety of the bottom surface is positioned inside the upper end, the abutting portion includes an extending portion extending from the pivoting shaft, and a protrusion screwed to an adjustment portion provided for the extending portion, and as the stage is lowered, the extending portion abuts against the upper end, and thereafter the protrusion abuts against the side surface.

* * * * *